US012787842B2

(12) United States Patent
Chen et al.

(10) Patent No.: US 12,787,842 B2
(45) Date of Patent: Nov. 3, 2026

(54) CHIP AND METHOD FOR FORMING THE SAME, AND PACKAGE STRUCTURE

(71) Applicant: BEIJING YOUZHUJU NETWORK TECHNOLOGY CO., LTD., Beijing (CN)

(72) Inventors: Haiying Chen, Beijing (CN); Lin Liu, Beijing (CN); Meng Mei, Beijing (CN); Jifeng Li, Beijing (CN); Jian Wang, Beijing (CN)

(73) Assignee: BEIJING YOUZHUJU NETWORK TECHNOLOGY CO., LTD., Beijing (CN)

( * ) Notice: Subject to any disclaimer, the term of this patent is extended or adjusted under 35 U.S.C. 154(b) by 389 days.

(21) Appl. No.: 18/614,053

(22) Filed: Mar. 22, 2024

(65) Prior Publication Data

US 2024/0321801 A1 Sep. 26, 2024

(30) Foreign Application Priority Data

Mar. 22, 2023 (CN) ......................... 202310286377.7

(51) Int. Cl.
*H10W 72/20* (2026.01)
*H10W 72/00* (2026.01)
(Continued)

(52) U.S. Cl.
CPC ....... *H10W 72/248* (2026.01); *H10W 72/012* (2026.01); *H10W 72/20* (2026.01);
(Continued)

(58) Field of Classification Search
CPC ............... H10W 72/20; H10W 72/012; H10W 72/01251; H10W 72/07253;
(Continued)

(56) References Cited

U.S. PATENT DOCUMENTS

2008/0283998 A1* 11/2008 Choi ...................... H05K 1/111 257/E23.141
2012/0098120 A1* 4/2012 Yu ......................... H10W 72/20 257/737

(Continued)

FOREIGN PATENT DOCUMENTS

CN 103367293 A 10/2013
CN 103915401 A 7/2014

(Continued)

OTHER PUBLICATIONS

International Search Report dated Jun. 11, 2024 in PCT Appl. No. PCT /CN 2024/083223, English translation (20 pages).

*Primary Examiner* — Earl N Taylor

(57) ABSTRACT

Embodiments of the present disclosure provides a chip and a method of forming the same and a package structure, the chip includes a base substrate and conductive bumps located on the base substrate, a planar shape of each bump has a long axis and a short axis extending through a center of the bump, a length of the long axis is greater than that of the short axis, the conductive bumps include bump unit rows each of which includes initial bump units arranged along a first direction and a first expanded bump unit located between adjacent initial bump units; the bump unit rows are arranged in a second direction, with a second expanded bump unit disposed between adjacent bump unit rows, the conductive bumps include a first pattern, a second pattern and an additional pattern formed by corresponding bumps, and each having bumps with different rotation angles.

20 Claims, 14 Drawing Sheets

(51) Int. Cl.
*H10W 72/30* (2026.01)
*H10W 74/15* (2026.01)
*H10W 90/00* (2026.01)

(52) U.S. Cl.
CPC .......... *H10W 72/01251* (2026.01); *H10W 72/07253* (2026.01); *H10W 72/232* (2026.01); *H10W 72/242* (2026.01); *H10W 72/30* (2026.01); *H10W 72/851* (2026.01); *H10W 74/15* (2026.01); *H10W 90/734* (2026.01)

(58) Field of Classification Search
CPC .......... H10W 72/232; H10W 72/242; H10W 72/248; H10W 72/30; H10W 72/851; H10W 74/15; H10W 90/734; H10W 72/90; H10W 72/241; H01L 24/32; H01L 24/73; H01L 24/11; H01L 24/13; H01L 24/14; H01L 24/16; H01L 2224/14133; H01L 2224/11; H01L 2224/1302; H01L 24/06; H01L 2224/117; H01L 2224/1183; H01L 2224/13022; H01L 2224/1414; H01L 2224/16055; H01L 2224/32225; H01L 2224/73204; H01L 2924/30107
See application file for complete search history.

(56) References Cited

U.S. PATENT DOCUMENTS

| | | | | |
|---|---|---|---|---|
| 2013/0062755 | A1* | 3/2013 | Kuo .......... | H10W 72/20<br>257/737 |
| 2013/0093079 | A1* | 4/2013 | Tu .......... | H10W 72/019<br>257/737 |
| 2015/0228571 | A1 | 8/2015 | Shiraki | |
| 2021/0074657 | A1* | 3/2021 | Wakioka .......... | H10W 72/20 |
| 2024/0222303 | A1* | 7/2024 | Kim .......... | H10W 70/65 |
| 2024/0421119 | A1* | 12/2024 | Sun .......... | H10W 72/072 |

FOREIGN PATENT DOCUMENTS

| | | | |
|---|---|---|---|
| CN | 110310929 | A | 10/2019 |
| JP | 2000138236 | A | 5/2000 |

* cited by examiner

CHIP AND METHOD FOR FORMING THE SAME, AND PACKAGE STRUCTURE

CROSS-REFERENCE TO RELATED APPLICATION(S)

The present application claims the priority of Chinese Patent Application No. 202310286377.7, filed on Mar. 22, 2023, and the disclosure of the above-mentioned Chinese Patent Application is incorporated herein by reference as a part of the present application.

TECHNICAL FIELD

The embodiments of the present disclosure relate to a chip and a method for forming the same, and a package structure.

BACKGROUND

With the increasingly raised requirements for computing power of semiconductor chips, demands for monolithic integration grows rapidly, which enables electronic package to develop towards high performance, high density, high reliability, miniaturization, low cost and more environmental protection. Under this trend, flip chip (FC) packaging technology emerges as the times demand. In a flip chip package structure, a connection between the chip and an interconnection component at a next tier (e.g., a package substrate) is realized by conductive bumps.

In the package structure, noise sources of power supply system include voltage drop on electrical paths, such as power supply path and grounding path, which is caused by transient current of load due to impedance. For example, when transient current flows through the conductive bump on the chip in the package structure, the conductive bump generates a parasitic inductance which, in turn, results in a voltage drop at the bump end. With the continuous development of packaging technology, more and more conductive bumps with increased arrangement density are provided on the chip. At present, how to reduce the inductance of the conductive bumps on the chip in the package structure is a key problem confronted by the packaging technology.

SUMMARY

At least one embodiment of the present disclosure provides a chip, including: a base substrate; and a plurality of conductive bumps, located on a side of the base substrate, wherein a planar shape of each bump of the plurality of conductive bumps in a direction parallel to a main surface of the base substrate has a long axis and a short axis which extend through a center of the bump, a length of the long axis is greater than a length of the short axis, and each bump has a rotation angle defined by an included angle between the long axis of the bump and a reference axis along a first direction, and the plurality of conductive bumps include: a plurality of bump unit rows, wherein each bump unit row of the plurality of bump unit rows includes a plurality of initial bump units arranged along the first direction and a first expanded bump unit located between adjacent initial bump units; wherein a plurality of bumps of each initial bump unit are arranged as a first pattern; the first expanded bump unit and part of bumps in adjacent initial bump units constitute a second pattern; and the second pattern is different from the first pattern; and a second expanded bump unit, including a plurality of bumps arranged in a row along the first direction, wherein the plurality of bump unit rows are arranged in a second direction, and each second expanded bump unit is located between adjacent bump unit rows in the second direction intersecting with the first direction, wherein part of bumps in the second expanded bump unit and part of bumps in adjacent bump unit rows constitute an additional pattern different from the first pattern and the second pattern, wherein numbers of bumps included in the first pattern, the second pattern and the additional pattern are the same; relative positional relationships of centers of bumps included in the first pattern, the second pattern and the additional pattern are the same; and the first pattern, the second pattern and the additional pattern each have bumps with different rotation angles.

At least one embodiment of the present disclosure provides a chip, including: a base substrate; and a plurality of conductive bumps, located on a side of the base substrate, wherein a planar shape of each bump of the plurality of conductive bumps in a direction parallel to a main surface of the base substrate has a long axis and a short axis extending through a center of the bump, and a length of the long axis is greater than a length of the short axis, wherein the plurality of conductive bumps include: a first bump row, including a plurality of first bump groups arranged along a first direction and one or more first additional bumps each located between adjacent first bump groups, wherein each of the plurality of first bump groups includes two first bumps adjacent to each other; a second bump row, including a plurality of bumps arranged along the first direction; a third bump row, including a plurality of second bump groups arranged along the first direction and one or more second additional bumps each located between adjacent second bump groups, wherein each of the plurality of second bump group includes two second bumps adjacent to each other; and a fourth bump row, including a plurality of bumps arranged along the first direction, wherein the first bump row to the fourth bump row are sequentially arranged along a second direction, and the second direction intersects with the first direction; wherein long axes of a plurality of bumps in the second bump row and the fourth bump row as well as the one or more first additional bump and the one or more second additional bump all extend along the second direction; extension directions of long axes of the first bumps and the second bumps are different from the first direction and the second direction; and the two first bumps in a same first bump group and the two second bumps in a corresponding same second bump group each have an end part being orientated toward a same one bump located in the second bump row.

At least one embodiment of the present disclosure provides a package structure, including: any one of abovementioned chips; and a package substrate, wherein the chip is electrically connected to the package substrate through the plurality of conductive bumps.

At least one embodiment of the present disclosure provides a method for forming a chip, including: providing a base substrate, and forming a plurality of conductive bumps on a side of the base substrate, wherein a planar shape of each bump of the plurality of conductive bumps in a direction parallel to a main surface of the base substrate has a long axis and a short axis which extend through a center of the bump, a length of the long axis is greater than a length of the short axis, and each bump has a rotation angle defined by an included angle between the long axis of the bump and a reference axis along a first direction, and the plurality of conductive bumps include: a plurality of bump unit rows, wherein each bump unit row of the plurality of bump unit rows includes a plurality of initial bump units arranged along the first direction and a first expanded bump unit located between adjacent initial bump units; wherein a plurality of bumps of each initial bump unit are arranged as a first pattern; the first expanded bump unit and part of bumps in adjacent initial bump units constitute a second pattern; and the second pattern is different from the first pattern; and a second expanded bump unit, including a plurality of bumps arranged in a row along the first direction, wherein the plurality of bump unit rows are arranged in a second direction, and each second expanded bump unit is located between adjacent bump unit rows in the second direction intersecting with the first direction, wherein part of bumps in the second expanded bump unit and part of bumps in adjacent bump unit rows constitute an additional pattern different from the first pattern and the second pattern; wherein numbers of bumps included in the first pattern, the second pattern and the additional pattern are the same; relative positional relationships of centers of bumps included in the first pattern, the second pattern and the additional pattern are the same; and the first pattern, the second pattern and the additional pattern each have bumps with different rotation angles.

BRIEF DESCRIPTION OF DRAWINGS

In order to more clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not limited to be a physical connection or mechanical connection, but may include an electrical connection, directly or indirectly.

Embodiments of the present disclosure provide a chip and a package structure including the chip. The chip includes a base substrate and a plurality of conductive bumps located on a side of the base substrate, wherein a planar shape of each bump of the plurality of conductive bumps in a direction parallel to a main surface of the base substrate has a long axis and a short axis extending through a center of the bump, a length of the long axis is greater than that of the short axis, and each bump has a rotation angle defined by an included angle between the long axis of the bump and a reference axis along a first direction. According to the embodiment of the present disclosure, the plurality of conductive bumps are disposed in a specific arrangement manner, so as to adjust a mutual inductance of corresponding bumps and optimize (for example, minimize or reduce to the greatest extent) the inductances of the plurality of conductive bumps, thereby decreasing the impedance in the circuit, reducing the voltage drop at the bump end of the chip, further reducing the noise of the power supply system and improving the device performance.

Figure 1:
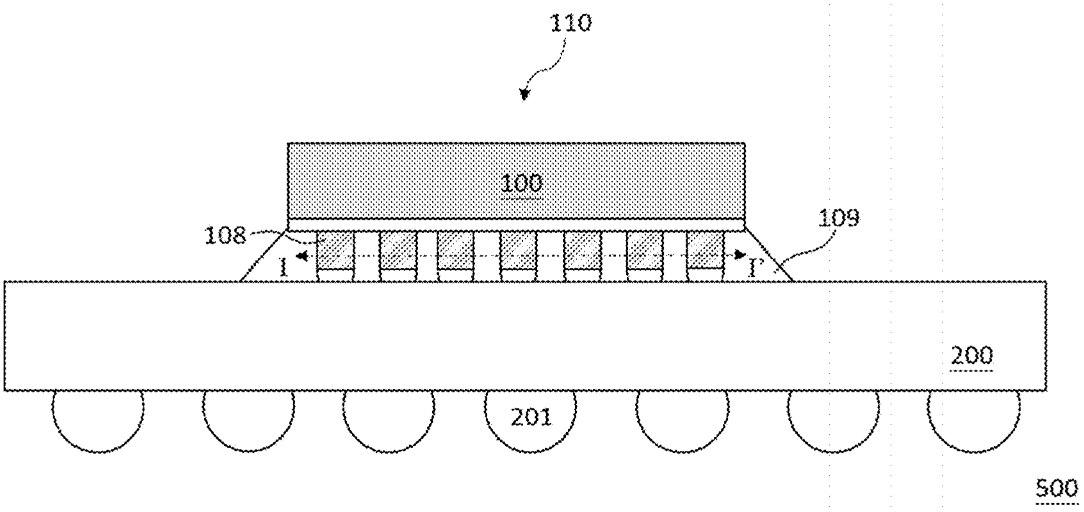
FIG. 1 illustrates a schematic cross-sectional view of a package structure according to some embodiments of the present disclosure.

FIG. 1 illustrates a schematic cross-sectional view of a package structure according to some embodiments of the present disclosure.

Referring to FIG. 1, in some embodiments, a package structure 500 includes a chip 110 and a package substrate 200. The chip 110 is mounted on and electrically connected to the package substrate 200. In some embodiments, the package structure 500 may be a flip chip (FC) package. For example, the chip 110 may include a base substrate 100 and a plurality of conductive bumps 108. The side of the chip 110 provided with the conductive bumps 108 may be referred to as an active side or a front side of the chip 110, and the side opposite to the front side may be referred to as a back side of the chip 110. For example, the active side of the chip 110 faces the package substrate 200 and is electrically connected to the package substrate 200 through a plurality of conductive bumps 108.

In some embodiments, the package structure 500 further includes an underfill layer 109. The underfill layer 109 fills a space between the die 110 and the package substrate 200, and surrounds and protects the plurality of conductive bumps 108. In some embodiments, conductive connectors 201 are provided at a side of the package substrate 200 away from the chip 110, and the conductive connectors 201 are electrically connected to the chip 110 through the package substrate 200, and the package structure 500 can be further connected to other package components or electronic components through the conductive connectors 201, but the present disclosure is not limited thereto. In some other embodiments, the package structure 500 may not be provided with the conductive connectors 201.

Figure 2A:
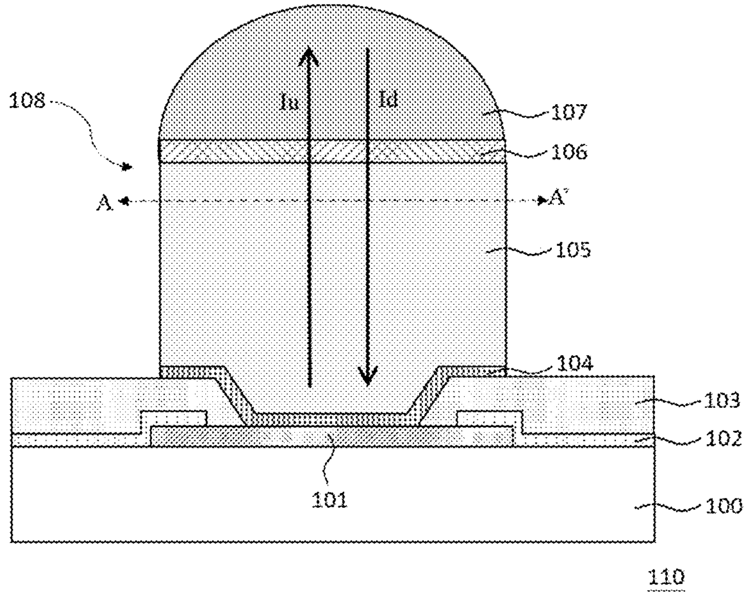
FIG. 2A illustrates a schematic cross-sectional view of a chip according to some embodiments of the present disclosure.

FIG. 2A illustrates a schematic cross-sectional view of a chip 110 in a package structure 500 according to some embodiments of the present disclosure in more details. It should be understood that, the orientation of the chip 110 in FIG. 2A is opposite to that of the chip 110 in FIG. 1; and in FIG. 2A, the active side of the chip 110 is facing upward. In addition, for simplicity of the drawing, only one conductive bump is illustrated in FIG. 2A, and it should be understood that the chip 110 is provided with a plurality of conductive bumps.

Referring to FIG. 2A, in some embodiments, the chip 110 includes a base substrate 100, a conductive pad 101, passivation layers 102 and 103, and a conductive bump 108. The base substrate 100 may be a semiconductor substrate, such as a silicon substrate, but the present disclosure is not limited thereto. The base substrate 100 may also include other semiconductor materials such as germanium, silicon germanium, gallium arsenide, or the like. In some embodiments, a device layer (not shown) including integrated circuit devices and an interconnection structure is further provided on the base substrate 100. For example, the integrated circuit devices may include active devices such as transistors and/or passive devices such as capacitors and resistors; the interconnection structure may include conductive wires and/or conductive vias connected to each other, and may be connected to a plurality of devices to form a functional circuit.

The conductive pad 101 is disposed on a side of the device layer away from the base substrate, and is electrically connected to the interconnection structure and the integrated circuit device in the device layer, so as to serve as an external connection window of the device layer. The conductive pad 101 includes a metal material, e.g., is an aluminum pad. The passivation layers 102 and 103 are disposed on the conductive pad 101, and cover a sidewall of the conductive pad 101 and part of a surface of the conductive pad 101 at the side away from the base substrate 100. The passivation layers 102 and 103 have openings therein, so as to expose part of the surface of conductive pad 101 for external connection. The passivation layers 102 and 103 may each include an insulating material such as silicon oxide, silicon nitride, silicon oxynitride, a polymer or combinations thereof, for example, the polymer material may include polyimide (PI) or the like. For example, the passivation layer 102 includes an inorganic insulating material such as silicon oxide, silicon nitride, silicon oxynitride, or the like, while the passivation layer 103 includes a polymer material such as polyimide. However, the present disclosure is not limited thereto.

The conductive bump 108 is disposed on a side of the conductive pad 101 away from the base substrate 100, and is filled in the openings of the passivation layers 102 and 103, so as to be electrically connected to the conductive pad 101, and further connected to the interconnection structure and/or the corresponding device in the device layer through the conductive pad 101. As a conductive terminal of the chip 110, the conductive bump 108 is used for external connection of the chip 110, for example, for electrical connection between the chip 110 and the package substrate 200 in FIG. 1. In some embodiments, an under bump metallurgy (UBM) layer 104 is further provided between the conductive bump 108 and both of the passivation layer 103 and the conductive pad 101.

In some embodiments, the conductive bump 108 may include a conductive pillar 105 and a conductive cap 107, and the conductive cap 107 is located on a side of the conductive pillar 105 away from the conductive pad 101. The conductive pillar 105 includes a metal material, for example, is a copper pillar; the conductive cap 107 may be a solder cap, and may also include other metal materials. In some embodiments, the conductive bump 108 may further include an intermediate layer 106 disposed between the conductive pillar 105 and the conductive cap 107, and may be used, for example, to improve an adhesion between the conductive pillar 105 and the conductive cap 107. The intermediate layer 106 may include, for example, a metal material such as nickel; however, the embodiment of the present disclosure is not limited thereto.

Figure 2B:
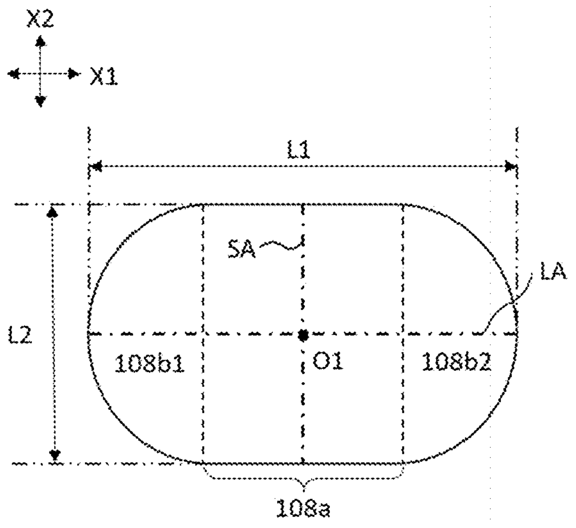
FIG. 2B and FIG. 2C illustrate schematic plan views and perspective views of conductive bumps in a chip according to some embodiments of the present disclosure.
Figure 2C:
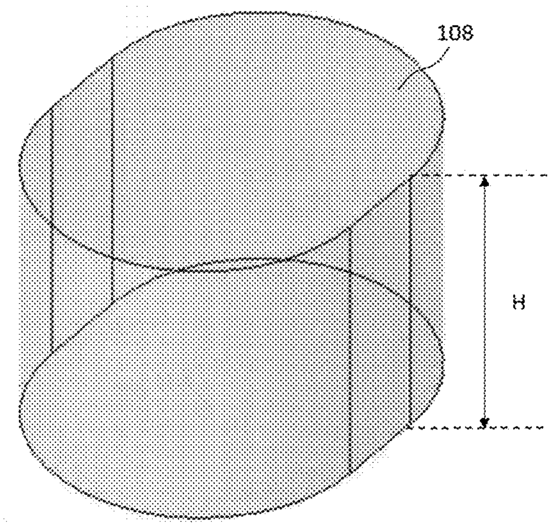

FIG. 2B illustrates a schematic plan view of the conductive bump 108 illustrated in FIG. 2A according to some embodiments of the present disclosure, and FIG. 2B is, for example, a plan view taken along a line A-A' of FIG. 2A parallel to the main surface of the base substrate 100. FIG. 2C illustrates a schematic perspective view of the conductive bump 108 illustrated in FIG. 2A according to some embodiments of the present disclosure.

Referring to FIG. 2B, in some embodiments, when observed in a plan view, the planar shape of the conductive bump 108 in the direction parallel to the main surface of the base substrate 100 may be a non-circular shape, such as a runway shape, an ellipse shape or an ellipse-like shape. For example, the planar shape of the conductive bump 108 has a long axis LA and a short axis SA, and a length L1 of the long axis LA is greater than a length L2 of the short axis SA; an intersection of the long axis LA and the short axis SA is a center O1 of the conductive bump 108. For example, in the case that the conductive bump 108 has an ellipse shape, the long axis LA and short axis SA thereof are the corresponding long axis and short axis of the ellipse. In some embodiments, the conductive bump 108 is in a runway shape or an ellipse-like shape, and has two straight edges extending in parallel along a direction X1 and an arc-shaped edge or an edge with other shapes connecting the two straight edges; the long axis LA extends in the direction X1, and the long axis LA is the longest line segment in the direction X1 that can be obtained by connecting two points on the edge of the conductive bump 108, while the short axis SA extends in a direction X2, and the short axis SA is the longest line segment in the direction X2 that can be obtained by connecting two points on the edge of the conductive bump 108; the direction X2 is perpendicular to the direction X1. For example, the long axis LA and the short axis SA are perpendicular bisectors of each other. It should be understood that, the long axis and the short axis are imaginary axes that define graphic properties of the conductive bump but are not components that actually exist on the surface of the conductive bump, so they are illustrated by dotted lines in the figure.

That is to say, the conductive bump 108 has a first length L1 and a second length L2, wherein the first length L1 is the longest length of the conductive bump 108 in the direction X1, and the second length L2 is the longest length of the conductive bump 108 in the direction X2. The first length L1 is greater than the second length L2. In one example, the length L1 of the conductive bump 108 may be 90 μm, and the length L2 may be 70 μm, but the present disclosure is not limited thereto.

In some exemplary embodiments, the conductive bump 108 has a runway shape, for example, the conductive bump 108 has a body part 108*a* and end parts 108*b*1 and 108*b*2 located on two opposite sides of the body part 108*a* (for example, in the direction X1). The shape of the body part 108*a* may be in a rectangular shape, such as an oblong shape or a square shape; the end part 108*b*1 or the end part 108*b*2 may have a shape with a curved edge, such as a semicircular shape or a bow shape, but the present disclosure is not limited thereto, and the end part 108*b*1 or the end part 108*b*2 may also have a shape with a non-curved edge, such as trapezoidal shape, for example. The end parts 108*b*1 and 108*b*2 may be symmetrical to each other with respect to the short axis SA, but the present disclosure is not limited thereto. For the convenience of description, a boundary between the body part and the end part is illustrated by a dotted line in FIG. 2B, but it should be understood that the conductive bump may be integrally formed, and there is no interface between the body part and the end part.

Referring to FIG. 2C, the conductive bump 108 may substantially have a pillar shape. In one example, a height H of the conductive bump 108 in a direction perpendicular to the main surface of the base substrate 100 may be, for example, 58 μm, but the embodiment of the present disclosure is not limited thereto.

Referring to FIG. 1 and FIG. 2A to FIG. 2C, the conductive bump 108 provides an electrical connection between the chip 110 and the package substrate 200, and the conductive bump 108 may be connected to a power net, a ground net, etc., such as VDD, VSS, etc. During the operation of the package structure, the current may flow through the conductive bump 108 in a direction perpendicular to the main surface of the base substrate 100. For example, as illustrated by the arrow of current direction Iu in FIG. 2A, the current may flow through the conductive bump 108 in a direction perpendicular to the main surface of the base substrate 100 and away from the base substrate 110. For example, the current may flow from the conductive pad 101 to the conductive bump 108, and may flow from one end of the conductive bump 108 close to the conductive pad 101 to the other end of the conductive bump away from the conductive pad 101, and such current direction Iu is referred to as "upward" current direction herein. Alternatively, in some other examples, as illustrated by the arrow of current direction Id in FIG. 2A, the current may flow through the conductive bump 108 in a direction perpendicular to the main surface of the base substrate 100 and towards the base substrate 110. For example, the current may flow from one end of the conductive bump 108 away from the conductive pad 101 to the other end of the conductive bump 108 close to the conductive pad 101, and may flow from the conductive bump 108 to the conductive pad 101, and such current direction Id is referred to as "downward" current direction herein.

In some embodiments, the chip 110 includes a plurality of conductive bumps 108, which may include bumps configured to transmit current in the same current direction and/or bumps configured to transmit current in different current directions. For example, among the plurality of conductive bumps 108, the current direction of some bumps is the upward direction, while the current direction of some other bumps is the downward direction.

In some embodiments, when current flows through the conductive bump 108, the conductive bump 108 will generate a parasitic inductance. This kind of inductance constitutes part of an impedance in the circuit. Impedance refers to opposition of resistance, inductance and/or capacitance to the flow of current in a circuit. The formula of impedance is as follows:

Impedance Z=R+j (XL−XC); wherein R, XL and XC are the resistance, the inductive reactance of the inductance, and the capacitive reactance of the capacitance, respectively;

Resistance R=ρL/S; where ρ, L and S are the resistivity, the length and the cross-sectional area of the resistive material, respectively;

Inductive reactance XL=2πfL; where π, f and L are the ratio of the circumference of a circle to its diameter, the current frequency and the inductance value, respectively;

Capacitive reactance XC=½πfC; where π, f and C are the ratio of the circumference of a circle to its diameter, the current frequency and the capacitance value, respectively;

Inductive reactance and capacitive reactance respectively refer to opposition of the inductance and the capacitance to the flow of current (for example, alternating current) in the circuit. From the above formula, it can be seen that the inductive reactance of the inductance in the circuit is positively correlated with the impedance. For example, in the case that the resistance and the capacitive reactance in the circuit remain unchanged, decreasing the inductive reactance can reduce the impedance. Under the condition of constant current frequency, decreasing the inductance (that is, inductance value) can reduce the inductive reactance, thereby reducing the impedance.

Therefore, decreasing the inductances of the plurality of conductive bumps 108 in the chip can reduce the impedance in the circuits of the chip and the package structure including the chip, thereby effectively reducing the voltage drop at the bump end of the chip, and further reducing the noise of the power supply system and improving the device performance. In some embodiments, the inductance generated by each conductive bump 108 may be constituted by a self-inductance and a mutual inductance generated by adjacent bumps. The formula for calculating the self-inductance of the conductive bump 108 is as follows:

$$L = 5.08h[ln(4h/d) + 1];$$

where L is the parasitic inductance generated by the self-inductance of the conductive bump, and h and d are respectively the height and the diameter of the conductive bump; in the case that the shape of the conductive bump is a non-circular shape such as a runway shape or an ellipse shape, the diameter d may be the length of the long axis.

From the above formula, it can be seen that the self-inductance of the conductive bump is related to dimensional parameters of itself. As a result, when the shape of the bump is determined, so does the self-inductance thereof. However, the mutual inductance of the conductive bump is mainly generated due to the bumps adjacent thereto, and the mutual inductance is related to structural relationships between bumps (for example, relative positional relationship and/or current directions of the bumps), or the like. Therefore, the mutual inductance of the bump can be adjusted by adjusting the positional relationship between bumps through configuring the arrangement manner of the plurality of conductive bumps, so as to decrease the inductances of the respective bumps, thereby reducing the impedance in the circuit of the chip and the package structure, reducing the voltage drop at the bump end of the chip, and further reducing the noise of the power supply system and improving the device performance.

In some embodiments, the arrangement mode of the corresponding bumps can be configured in combination with the current directions configured by the plurality of bumps, thereby reducing the parasitic inductances of the plurality of conductive bumps. In some embodiments, in the cast that positions of bump centers of a plurality of bumps are determined, the positional relationship between bumps can be adjusted by adjusting the rotation angles and/or the arrangement directions of the respective bumps.

Figure 3:
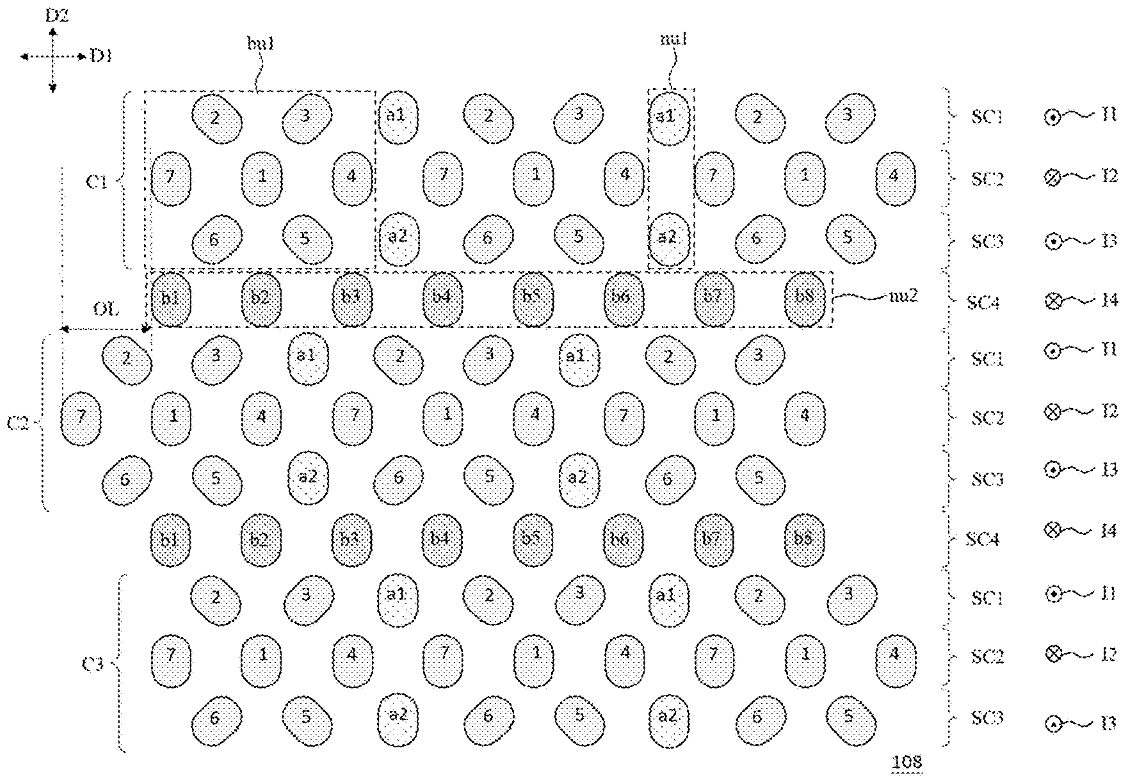
FIG. 3 illustrates a schematic plan view of a plurality of conductive bumps in a chip according to some embodiments of the present disclosure.

FIG. 3 illustrates a schematic plan view of a plurality of conductive bumps of a chip in a package structure according to some embodiments of the present disclosure, which schematically illustrates the arrangement mode of the plurality of conductive bumps. FIG. 3 is, for example, a plan view along the line I-I' in FIG. 1, and the line I-I' is parallel to a main surface of the package substrate 200 or the chip 110. For simplicity of the drawings, only a plurality of conductive bumps 108 are illustrated in FIG. 3, and other components (e.g., the underfill layer 109) of the package structure 500 are not illustrated. The plurality of conductive bumps 108 may include the plurality of bumps 1-7, a1, a2, b1-b8 illustrated in FIG. 3, and each bump may have the shape and characteristics described above with reference to the conductive bump 108 in FIG. 2A to FIG. 2C. That is to say, the planar shape of each bump in the direction parallel to the main surface of the base substrate has a long axis and a short axis extending through the center of the bump, and the length of the long axis is greater than that of the short axis. Each bump has a rotation angle defined by an included angle between the long axis of the bump and a reference axis along a first direction (e.g., direction D1). In some embodiments, the shapes and sizes (e.g., length, height, etc.) of the respective bumps among the plurality of conductive bumps 108 are substantially the same as each other.

Referring to FIG. 3, in some embodiments, the plurality of conductive bumps 108 include a plurality of bump unit rows C1, C2, C3. Each bump unit row includes a plurality of initial bump units bu1 and first expanded bump unit(s) nu1 arranged along the direction D1. Each first expanded bump unit nu1 is arranged between adjacent two initial bump units bu1 in the direction D1. The plurality of bump unit rows C1-C3 are arranged along the direction D2, and a second expanded bump unit nu2 is further arranged between adjacent bump unit rows. For example, every two adjacent bump unit rows (e.g., C1 and C2, C2 and C3) are provided with one second expanded bump unit nu2 therebetween. The directions D1 and D2 are both parallel to the main surface of the base substrate and intersect with each other, for example, the direction D1 and the direction D2 may be perpendicular to each other. The direction D1 and the direction D2 may also be referred to as a first direction and a second direction, respectively, or vice versa. It should be noted that, herein, as illustrated in FIG. 3, each of the directions D1 and D2 includes two directions opposite to each other.

In some embodiments, each bump unit row C1, C2, C3 may include a plurality of rows of conductive bumps each arranged in a row along the direction D1, for example, three rows of conductive bumps, and each second expanded bump unit nu2 may include one row of conductive bumps. However, the present disclosure is not limited thereto.

For example, each bump unit row C1-C3 includes a first bump row SC1, a second bump row SC2, and a third bump row SC3. The initial bump unit bu1 may include a plurality of bumps respectively located in the first bump row SC1, the second bump row SC2 and the third bump row SC3; for example, each initial bump unit bu1 includes two bumps (for example, bumps 2 and 3) located in the first bump row SC1, three bumps (for example, bumps 1, 4 and 7) located in the second bump row SC2, and two bumps (for example, bumps 5 and 6) located in the third bump row SC3. Each first expanded bump unit nu1 includes two bumps (for example, bumps a1 and a2) located in the first bump row SC1 and the third bump row SC3, respectively. In some embodiments, the first expanded bump unit nu1 may not include a bump located in the second bump row SC2, but embodiments of the present disclosure are not limited thereto. The second expanded bump unit nu2 includes, for example, a plurality of bumps b1-b8 arranged in a row in the direction D1, and the plurality of bumps b1-b8 of the second expanded bump unit nu2 may be located in a bump row SC4, which may also be referred to as a fourth bump row. In some embodiments, centers of a plurality of bumps (i.e., the intersection of the long axis and the short axis of the respective bumps) located in the same bump row are aligned with each other in the direction D1.

In some embodiments, a plurality of bumps located in the same row have the same current direction, while a plurality of bumps located in adjacent rows may have different (e.g., opposite) current directions. For example, a plurality of bumps located in odd rows are configured to transmit current in a first current direction, and a plurality of bumps located in even rows are configured to transmit current in a second current direction; the first current direction and the second current direction are different from each other, for example, opposite to each other. For example, the current direction of the plurality of bumps located in odd rows is the upward direction, while the current direction of the plurality of bumps located in even rows is the downward direction; alternatively, the current direction of the plurality of bumps located in odd rows is the downward direction, while current direction of the plurality of bumps located in even rows is the upward direction. It should be understood that, herein, a bump having a certain current direction means that the bump is configured to transmit current in the current direction (for example, during the operation of the chip/package structure), that is, during the operation of the chip/package structure, the current flows through the bump in the current direction, while the bump may have no current flow therethrough when the chip/package structure is in a non-operation state, for example.

In some embodiments, as illustrated in FIG. 3, current directions I1 and I3 of a plurality of bumps located in the first bump row SC1 and the third bump row SC3 are the same, and are all upward directions, for example, i.e., corresponding to the current direction Iu illustrated in FIG. 2A; current directions I2 and I4 of a plurality of bumps located in the second bump row SC2 and the fourth bump row SC4 are the same, and are all downward directions, for example, i.e., corresponding to the current direction Id illustrated in FIG. 2A. In some other embodiments, current directions of a plurality of bumps located in the first bump row SC1 and the third bump row SC3 may also be downward directions; correspondingly, current directions I2 and I4 of a plurality of bumps located in the second bump row SC2 and the fourth bump row SC4 are upward directions. It should be noted that, current directions of various rows of conductive bumps are schematically illustrated in FIG. 3, and for the sake of simplicity, a symbol representing the current direction is marked at a side of each row of conductive bumps rather than being marked in each conductive bump. It should be understood that, these current directions I1 and I2 represent the directions of the current flowing through the respective conductive bumps, and the positions of the symbols in the figures are not the positions where the actual current flows.

In some embodiments, bumps with the same current direction may be connected to the same net in the circuit, while bumps with different current directions may be connected to different nets in the circuit. For example, a plurality of bumps located in the first bump row SC1 and the third bump row SC3 are connected to a same first net; while a plurality of bumps located in the second bump row SC2 and the fourth bump row SC4 are connected to a same second net; and the first net is different from the second net, for example, the first net is a power net (e.g., power net VDD) and the second net is a grounding net (e.g., grounding net VSS), or vice versa. However, the present disclosure is not limited thereto.

In some embodiments, the bumps in adjacent rows are staggered and misaligned with each other in the direction D2, while the bumps separated by one row may be arranged in columns and aligned in the direction D2. For example, at least some bumps of a plurality of bumps located in odd rows (for example, the first bump row SC1 and the third bump row SC3) are arranged in columns in the direction D2 and aligned in the direction D2, and at least some bumps of a plurality of bumps located in even rows (for example, the second bump row SC2 and the fourth bump row SC4) are arranged in columns in the direction D2 and aligned in the direction D2; while the plurality of bumps located in odd rows and the plurality of bumps located in even rows are not aligned in the direction D2 but are offset from each other in the direction D1. It should be understood that, the plurality of bumps being arranged in columns and aligned in the direction D2 includes the following case: the plurality of bumps are arranged in one or more columns in the direction D2, and the centers of the plurality of bumps in the same column are aligned with each other in the direction D2.

In some embodiments, the two bumps 2 and 3 of the initial bump unit bu1 that are located in the first bump row SC1 may be referred to as first bumps, and the two bumps 2 and 3 constitute a first bump group; the two bumps 5 and 6 of the initial bump unit bu1 that are located in the third bump row SC3 may be referred to as second bumps, and the two bumps 5 and 6 constitute a second bump group; the two bumps a1 and a2 in the first expanded bump unit nu1 may be referred to as a first additional bump and a second additional bump, respectively. The bump unit row may also be referred to as a repeating unit, and each repeating unit is constituted by a first bump row SC1, a second bump row SC2 and a third bump row SC3.

In other words, the plurality of conductive bumps 108 include a first bump row SC1, a second bump row SC2, a third bump row SC3 and a fourth bump row SC4. The first bump row SC1 includes a plurality of first bump groups arranged along the direction D1 and first additional bump(s) a1 located between adjacent first bump groups, wherein each first bump group includes two first bumps (i.e., bumps 2 and 3) adjacent to each other. The second bump row SC2 includes a plurality of bumps arranged along the direction D1. The third bump row SC3 includes a plurality of second bump groups arranged along the direction D1 and second additional bump(s) a2 located between adjacent second bump groups, wherein each second bump group includes two second bumps (i.e., bumps 5 and 6) adjacent to each other. The fourth bump row SC4 includes a plurality of bumps arranged along the direction D1. The first bump row SC1 to the fourth bump row SC4 are arranged in sequence along the direction D2.

In some embodiments, the long axes of the plurality of bumps in the second bump row SC2 and the fourth bump row SC4, as well as the first additional bumps a1 and the second additional bumps a2 all extend along the direction D2; the extension directions of the long axes of the first bumps 2, 3 and the second bumps 5, 6 are different from the directions D1 and D2, and two first bumps 2, 3 in the same first bump group and two second bumps 5, 6 in the corresponding same second bump group each have an end part being orientated toward the one and same bump 1 located in the second bump row SC2. That is, in the same initial bump unit bu1, the first bumps 2, 3 and the second bumps 5, 6 each have an end part being orientated toward the bump 1.

In some embodiments, the first bump row SC1, the second bump row SC2 and the third bump row SC3 constitute a repeating unit; and the plurality of conductive bumps include a plurality of the repeating units arranged in the direction D2 and a fourth bump row SC4 located between adjacent repeating units. That is to say, one fourth bump row SC4 is arranged between every two repeating units. In some embodiments, adjacent two repeating units (e.g., bump unit rows C1 and C2, bump unit rows C2 and C3) are offset from each other in the direction D1. For example, edges of adjacent two repeating units are laterally offset by a distance OL in the direction D1.

In some embodiments, the plurality of bumps have substantially the same shape and the same size (e.g., the length of the long axis, the length of the short axis, etc.), but the arrangement modes (e.g., the arrangement direction, the rotation angle and the like described below) of the respective bumps may be the same or different, and the plurality of bumps may constitute a plurality of different bump patterns.

In some embodiments, through configuring the plurality of bumps in the arrangement mode illustrated in FIG. 3, the parasitic inductance of the bumps can be effectively decreased, thereby reducing the impedance in the circuit where the bumps are located, reducing the voltage drop at the bump end of the chip, further reducing the noise of the power supply system and improving the device performance.

FIG. 4A to FIG. 4F illustrate schematic diagrams of various bump patterns formed by the arrangement of the plurality of conductive bumps illustrated in FIG. 3 according to some embodiments of the present disclosure. In these figures, a schematic plan view of the overall arrangement of the plurality of conductive bumps is shown at the left side of the arrow, and a schematic enlarged view corresponding to a bump pattern is shown at the right side of the arrow. It should be noted that the long axis, short axis and center of each bump illustrated in the enlarged view are identified in the same way as those in FIG. 2B, and for the sake of simplicity of the drawings, reference symbols LA, SA and O1 of these long axes, short axes and centers are not specifically illustrated in FIG. 4A to FIG. 4F.

Referring to FIG. 4A to FIG. 4F, each bump has a rotation angle defined by an included angle between the long axis thereof and a reference axis (e.g., reference axe HL1, HL2, HL3 illustrated in the figure) extending in a direction D1. In some embodiments, bump patterns constituted by corresponding bumps among the plurality of conductive bumps 108 may include a first pattern P1, a second pattern P2 and additional patterns P3 to P6. For example, a plurality of bumps 1-7 in each initial bump unit bu1 are arranged as a first pattern P1; the first expanded bump unit nu1, together with some bumps in the adjacent initial bump unit bu1, may constitute a second pattern P2, and the second pattern P2 is different from the first pattern P1; some bumps in the second expanded bump unit nu2, together with some bumps in the adjacent bump unit row, may constitute an additional pattern different from the first pattern P1 and the second pattern P2.

In some embodiments, the number of the bumps as well as the relative positional relationship of the centers of the bumps included in the first pattern P1, the number of the bumps as well as the relative positional relationship of the centers of the bumps included in the second pattern P2 and the number of the bumps as well as the relative positional relationship of the centers of the bumps included in each of the additional patterns P3 to P6 may be the same as each other; and each of the first pattern P1, the second pattern P2 and the additional patterns P3 to P6 includes bumps having different rotation angles. The rotation angles and/or arrangement directions of the corresponding bumps in different patterns may be different from each other. In the present disclosure, the arrangement direction of the bump may be the extension direction of the long axis or the short axis of the bump, and hereinafter the arrangement direction of the bump specifically refers to the extension direction of the long axis thereof.

For example, the first pattern P1, the second pattern P2 and the additional patterns P3 to P6 each include seven bumps. For example, each of the first pattern P1, the second pattern P2 and the additional patterns P3 to P6 may include a central bump CB1 and a peripheral bump group arranged around and surrounding the central bump CB1; each peripheral bump group includes a peripheral bump PB2, a peripheral bump PB3, a peripheral bump PB4, a peripheral bump PB5, a peripheral bump PB6 and a peripheral bump PB7 arranged clockwise or counterclockwise. The peripheral bump PB2, the peripheral bump PB3, the peripheral bump PB4, the peripheral bump PB5, the peripheral bump PB6 and the peripheral bump PB7 may be referred to as a second peripheral bump, a third peripheral bump, a fourth peripheral bump, a fifth peripheral bump, a sixth peripheral bump and a seventh peripheral bump respectively, but the order of these bumps is not limited thereto.

In some embodiments, the central bump CB1 as well as the peripheral bumps PB4 and PB7 may be located in the same bump row, and the central bump CB1 is located between the peripheral bumps PB4 and PB7, and the centers of the three bumps are aligned with each other in the direction D1; the peripheral bumps PB2 and PB3 are located in the same bump row and have centers aligned with each other in the direction D1, and the peripheral bumps PB5 and PB6 are located in the same bump row and have centers aligned with each other in the direction D1; and a group including the peripheral bumps PB2, PB3 and a group including the peripheral bumps PB5, PB6 are respectively located in two bump rows on two opposite sides of and adjacent to the bump row where the central bump CB1 is located. In each of the above bump patterns, a plurality of peripheral bumps PB2 to PB7 of the peripheral bump group may include a bump with a rotation angle as same as that of the corresponding central bump CB1, and may also include a bump with a rotation angle different from that of the central bump CB1. It should be understood that, each bump of the plurality of conductive bumps may be included in different patterns and serving as a central bump or a peripheral bump.

In some embodiments, in each of the first pattern P1, the second pattern P2, and the additional patterns P3 to P6, center connecting lines of the six bumps in the peripheral bump group (i.e., peripheral bumps PB2 to PB7) may constitute, for example, a hexagon (e.g., a convex hexagon), and the center of the central bump CB1 is located at or near a center of the hexagon. For example, the center of the central bump CB1 is located at a midpoint of a center connecting line of the peripheral bumps PB4 and PB7; the peripheral bumps PB2 and PB6 may be arranged in a column in the direction D2, and the centers thereof are aligned with each other in the direction D2; the peripheral bumps PB3 and PB5 may be arranged in a column in the direction D2, and the centers thereof are aligned with each other in the direction D2. Centers of the peripheral bumps PB2 and PB6, and centers of the peripheral bumps PB3 and PB5 are staggered and misaligned with centers of the central bump CB1 and the peripheral bumps PB4, PB7 in the direction D2. For example, orthographic projections of the centers of the peripheral bumps PB2 and PB6 on the reference axis HL2 are located between the center of the central bump CB1 and the center of the peripheral bump PB7; and orthographic projections of the centers of the peripheral bumps PB3 and PB5 on the reference axis HL2 are located between the center of the central bump CB1 and the center of the peripheral bump PB4. The reference axis HL2 extends in the direction D1 and passes through the centers of the central bump CB1 and the peripheral bumps PB4, PB7.

In some embodiments, the center connecting line of the peripheral bumps PB2, PB6 and the center connecting line of the central bump CB1 and the peripheral bump PB7 may be perpendicular bisectors of each other, for example; the center connecting line of the peripheral bumps PB3 and PB5 and the center connecting line of the central bump CB1 and the peripheral bump PB4 may be perpendicular bisectors of each other, for example.

In some embodiments, in a plurality of conductive bumps 108, adjacent two bumps in a bump row has a pitch therebetween, and pitches between different adjacent two bumps in the same bump row are substantially the same, and pitches between adjacent bumps in various bump rows may be substantially the same. In the present disclosure, the "pitch" between two bumps refers to a distance between centers of the two bumps, that is, a length of the center connecting line thereof. In some embodiments, distances (e.g., pitches and/or spacings) between the respective adjacent two bumps in adjacent bump rows may be substantially the same, and the distance (e.g., the pitch and/or the spacing) between adjacent two bumps in adjacent bump rows may be smaller than the distance between adjacent two bumps in the same bump row. For example, the distance between adjacent two bumps 1 and 2 located in adjacent bump rows SC2 and SC1 may be smaller than the distance between adjacent two bumps 1 and 4 located in the same bump row SC2.

In some embodiments, in each bump pattern, a distance between the central bump CB1 and the fourth peripheral bump PB4 or between the central bump CB1 and the seventh peripheral bump PB7 is greater than a distance between the central bump CB1 and one of the second peripheral bump PB2, the third peripheral bump PB3, the fifth peripheral bump PB5 and the sixth peripheral bump PB5; the aforesaid distance may be the pitch, spacing, etc. between the corresponding bumps.

For example, in each bump pattern, a pitch (pitch) PL2 between the central bump CB1 and the peripheral bump PB4 or between the central bump CB1 and the peripheral bump PB7 located in the same bump row is greater than a pitch PL1 between the central bump CB1 and either one of the peripheral bumps PB2, PB3, PB5, PB6 located in adjacent bump rows. The pitch PL2 between the central bump CB1 and the peripheral bump PB4 and the pitch PL2 between the central bump CB1 and the peripheral bump PB7 may be substantially the same, and the pitches PL1 between the central bump CB1 and the peripheral bumps PB2, PB3, PB5, PB6 may be substantially the same. In some embodiments, a pitch PL3 between two peripheral bumps located in adjacent bump rows and adjacent to each other, among the peripheral bumps PB2 to PB7 (that is, adjacent two peripheral bumps whose center connecting line forms a side of the hexagon), is substantially the same as the pitch PL1, while a pitch between two peripheral bumps located in the same bump row and adjacent to each other, among the peripheral bumps PB2 to PB7, is substantially equal to the pitch PL2.

For example, in each bump pattern, spacings d4, d7 respectively between the central bump CB1 and the peripheral bumps PB4, PB7 that are located in the same bump row as the central bump are greater than spacings d2, d3, d5, d6 respectively between the central bump CB1 and the peripheral bumps PB2, PB3, PB5, PB6 that located in bump rows adjacent to the bump row where the center bump is located. In the present disclosure, the "spacing" between two bumps refers to a distance between edges of the two bumps. Because each bump has an arc-shaped end, the spacing between two bumps may have different values at different positions, and the above-mentioned spacing refers to a minimum spacing between corresponding bumps.

Figure 4A:
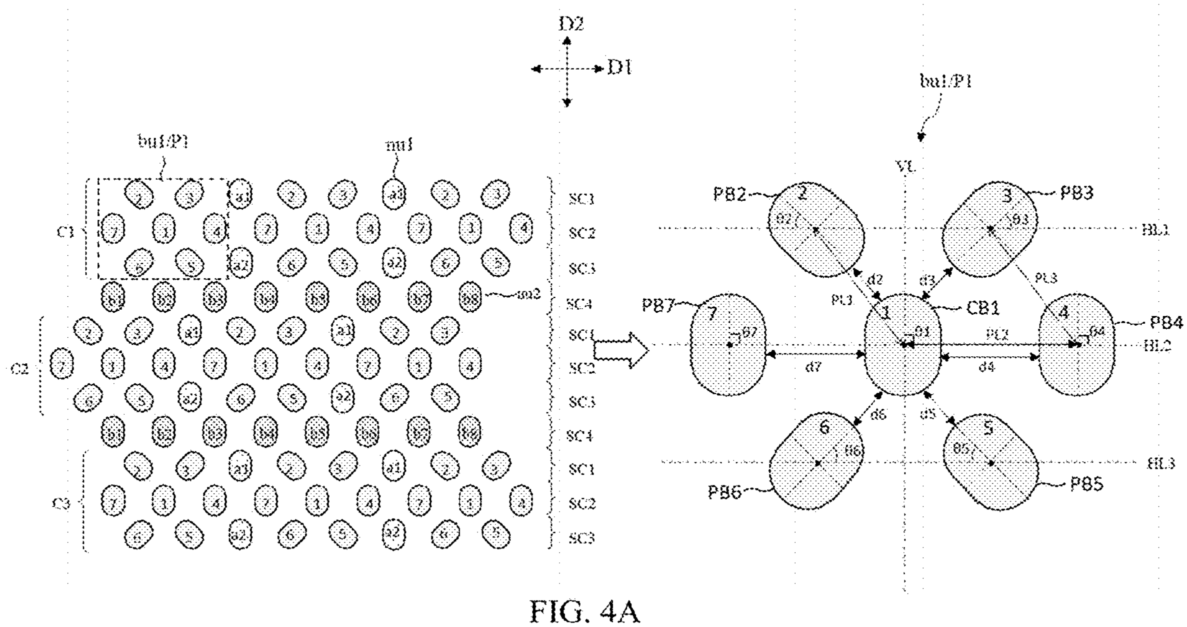
FIG. 4A to FIG. 4F illustrate schematic plan views of a plurality of conductive bumps in a chip and an enlarged view of some bump patterns according to some embodiments of the present disclosure.

In some embodiments, in at least one of a plurality of bump patterns, for example, in the first pattern P1 as illustrated in FIG. 4A, a difference (or referred to as a first difference) between the pitch PL2 (between the central bump CB1 and the peripheral bump PB4, PB7) and the spacing d4/d7 is smaller than a difference (or referred to as a second difference) between the pitch PL1 (between the central bump CB1 and the peripheral bump PB2, PB3, PB5, PB6) and the spacing d2/d3/d5/d6. In some embodiments, the pitch between adjacent bumps located in the same bump row is set to be greater than the pitch between adjacent bumps in adjacent bump rows, so that the spacing between adjacent bumps located in the same bump row may be greater than the spacing between adjacent bumps in adjacent bump rows. In some embodiments, by configuring the rotation angles and/or arrangement directions of the corresponding bumps, the first difference is made to be smaller than the second difference, through which the spacing between adjacent bumps in the same bump row can be further increased relatively (for example, maximized) and the spacing between adjacent bumps in adjacent bump rows can be reduced relatively (for example, minimized).

In some embodiments, an inductance value generated by each bump is constituted by a self-inductance of the bump and a mutual inductance generated by surrounding bumps with respect to this bump. Taking the central bump CB1 as an example, the inductance value of the central bump may be constituted by its self-inductance and the mutual inductance generated due to the peripheral bumps PB2-PB7. For the peripheral bumps PB4 and PB7 which are located in the same bump row as the central bump CB1 and have the same current direction as the central bump CB1, an induced electromotive force (i.e., mutual inductance electromotive force) generated by the mutual inductance on the central bump CB1 generated due to the peripheral bumps PB4, PB7 has a direction as same as a direction of an induced electromotive force (i.e., self-inductance electromotive force) generated by the self-inductance of the central bump CB1, i.e., the mutual inductance on the central bump CB1 generated due to the peripheral bumps PB4, PB7 is positively correlated with an overall inductance value of the central bump CB1. In this way, by setting a distance between the peripheral bumps PB4, PB7 and the central bump CB1 to be larger, the mutual inductance on central bump CB1 generated due to the peripheral bumps PB4, BP7 can be reduced, and hence the inductance value of the central bump CB1 can be reduced, that is, the inductive reactance of the central bump CB1 and the impedance of the circuit where the central bump CB1 is located can be reduced. For the peripheral bumps PB2, PB3, PB5, PB6 which are located in an adjacent bump row and have an opposite current direction relative to the central bump CB1, an induced electromotive force generated by the mutual inductance on the central bump CB1 generated due to the peripheral bumps PB2, PB3, PB5, PB6 is opposite to an induced electromotive force generated by the self-inductance of the central bump CB1; that is to say, a mutual inductance electromotive force on the central bump CB1 generated due to the peripheral bumps PB2, PB3, PB5, PB6 can cancel out at least part of a self-inductance electromotive force of the central bump CB1; that is, the mutual inductance on the central bump CB1 generated due to the peripheral bumps PB2, PB3, PB5, PB6 is negatively correlated with the overall inductance value of the central bump CB1, to a certain extent. In this way, to a certain extent, by setting a distance between the central bump CB1 and the peripheral bump PB2, PB3, PB5, PB6 to be smaller, the mutual inductance electromotive force on the central bump CB1 generated due to these peripheral bumps is increased, so that more self-inductance electromotive force of the central bump CB1 can be cancelled out by the mutual inductance electromotive force, thereby reducing the inductance value of the central bump CB1, i.e., reducing the inductive reactance of the central bump CB1 and the impedance of the circuit where the central bump is located.

In other words, in some embodiments, for the central bump and the peripheral bump with the same current direction, the farther the distance between the two bumps is, the smaller the inductance of the central bump will be; for the central bump and the peripheral bump with opposite current directions, the closer the distance between the two bumps is, the smaller the inductance of the central bump will be.

Therefore, in some embodiments, by setting the distance (pitch and/or spacing) between the central bump and the peripheral bump that is located in the same row as the central bump to be greater than the distance (pitch and/or spacing) between the central bump and the peripheral bump that is located in an adjacent row with respect to the central bump, the mutual inductance on the central bump generated due to the peripheral bump in the same row can be reduced, and the mutual inductance on the central bump generated due to the peripheral bump in an adjacent row can be increased, thereby reducing the overall inductance of the central bump and hence reducing the impedance of the circuit where the bumps are located, and correspondingly reducing the voltage drop at two ends of the central bump when current flows through the central bump. In some embodiments, in the case that positions of centers of a plurality of bumps are fixed (i.e., the pitches between the bumps are fixed), the spacings between bumps are adjusted by adjusting the rotation angles and/or arrangement directions of the plurality of bumps, thereby further reducing the inductance of the corresponding bumps.

In some embodiments, the first pattern P1, the second pattern P2 and the additional patterns P3 and P4 have patterns different from each other; for example, the rotation angles and/or arrangement directions of some bumps (central bumps and/or peripheral bumps) in these patterns are different.

It should be understood that, each bump of the plurality of conductive bumps can be combined with different bumps to constitute different patterns, and each bump can play different roles in different patterns. For example, a certain bump is used as a central bump in the first pattern P1 and used as a peripheral bump in the second pattern P2, or it can also be used as a peripheral bump located at another different position in other additional pattern(s). That is to say, adjacent bump patterns may share one or more bumps. In addition, each of the first pattern P1, the second pattern P2 and the additional patterns P3 to P6 may include a pattern illustrated in an enlarged view of the drawings, and an equivalent pattern obtained by rotating or mirror-flipping (for example, horizontally flipping or vertically flipping) the illustrated pattern; these equivalent patterns are substantially the same as the corresponding patterns illustrated in FIGS. 4A to 4F, and such mutually equivalent patterns are regarded as the same patterns.

Referring to FIG. 4A, in some embodiments, a plurality of bumps (i.e., bumps 1-7) of the initial bump unit bu1 are arranged as a first pattern P1. For example, patterns respectively constituted by a plurality of initial bump units bu1 are the same as each other, and the seven bumps in each initial bump unit bu1 constitute one first pattern P1. In other words, the plurality of conductive bumps 108 include a plurality of first patterns P1, and each first pattern P1 is constituted by the plurality of bumps 1-7 in one corresponding initial bump unit bu1.

For example, in each initial bump unit bu1, the bump 1 serves as the central bump CB1 of the first pattern P1, and the bumps 2, 3, 4, 5, 6, 7 serve as the peripheral bumps PB2, PB3, PB4, PB5, PB6, PB7 of the peripheral bump group in the first pattern P1, respectively.

In some embodiments, in the first pattern P1, the arrangement directions and/or rotation angles of some bumps are different from each other. It should be understood that, if different bumps have the same arrangement direction, it means that they also have the same rotation angle; and if different bumps have the same rotation angle, they may have the same arrangement direction or different arrangement directions. In some embodiments, in the first pattern P1, the arrangement directions (i.e., extension directions of long axes) and rotation angles of some peripheral bumps in the peripheral bump group are the same as those of the central bump CB1, while the arrangement directions and rotation angles of some other peripheral bumps in the peripheral bump group are different from those of the central bump CB1.

For example, the peripheral bumps PB4 and PB7 located in the same bump row as the central bump CB1 have the same arrangement direction and rotation angle as those of the central bump CB1, while the peripheral bumps PB2, PB3, PB5 and PB6 located in adjacent rows relative to the central bump CB1 have arrangement directions and rotation angles different from those of the central bump CB1; and the rotation angles of the peripheral bumps PB2, PB3, PB5 and PB6 may be the same with each other. For example, the central bump CB1 and the peripheral bumps PB4, PB7 have a first rotation angle, and the peripheral bumps PB2, PB3, PB5 and PB6 have a second rotation angle, which is different from the first rotation angle, for example, the second rotation angle may be smaller than the first rotation angle. For example, the first rotation angle may range from 75 degrees to 90 degrees, and the second rotation angle may range from 50 degrees to 65 degrees, or range from 51 degrees to 63 degrees. In some embodiments, the peripheral bumps PB2, PB3, PB5 and PB6 each have an end part being orientated toward the central bump CB1. In some embodiments, under the premise of satisfying process requirements and density requirements for bumps, the spacing between the central bump CB1 and the peripheral bumps PB4, PB7 can be relatively increased (for example, maximized), and the spacing between the central bump CB1 and the peripheral bumps PB2, PB3, PB5, PB6 can be relatively reduced (for example, minimized) through the above-described arrangement modes, thereby achieving the effect of reducing the overall inductance of the central bump CB1.

In some examples, in the first pattern P1, the rotation angles θ1, θ4, θ7 of the central bump CB1 and the peripheral bumps PB4, PB7 are all 90 degrees; the long axes of these bumps may extend parallel to each other along the direction D2, and the short axes of these bumps extend along the direction D1, wherein the directions D2 and D1 are substantially perpendicular to each other. The rotation angles θ1, θ4, θ7 are included angles between the long axes of the central bump CB1, the peripheral bump PB4, the peripheral bump PB7 and the reference axis HL2 extending along the direction D1, respectively. That is to say, the long axes of the central bump CB1 and the peripheral bumps PB4, PB7 are substantially perpendicular to the reference axis HL2, and the short axes of the central bump CB1 and the peripheral bumps PB4, PB7 have the same extension direction as that of the reference axis HL2; the reference axis HL2 is, for example, an extension line of the short axis of the central bump CB1 or the peripheral bumps PB4, PB7, or coincides with the extension lines of the short axes of these bumps. In some embodiments, the peripheral bumps PB4 and PB7 may be symmetrical to each other with respect to the extension line VL of the long axis of the central bump CB1. It should be noted that, herein, "directions (e.g., current directions, extension directions, etc.) being the same" includes the case where the directions are exactly the same, or the case where the directions are parallel to each other.

For example, in the first pattern P1, the rotation angles θ2, θ3, θ5 and θ6 of the peripheral bumps PB2, PB3, PB5 and PB6 may all be 60 degrees, for example. The rotation angles θ2 and θ3 of the peripheral bumps PB2 and PB3 are included angles between their long axes and the reference axis HL1 extending along the direction D1, respectively; and the rotation angles θ5 and θ6 of the peripheral bumps PB5 and PB6 are included angles between their long axes and the reference axis HL3 extending along the direction D1, respectively. The long axes and short axes of the peripheral bumps PB2, PB3, PB5 and PB6 all extend along directions different from the directions D1 and D2. The peripheral bumps PB2, PB3, PB5 and PB6 include bumps with the same arrangement direction, and also include bumps with different arrangement directions.

For example, two peripheral bumps located in an adjacent row of the central bump CB1 and located in a same bump row have different arrangement directions; two peripheral bumps located in adjacent rows of the central bump CB1 and located in a same bump column have different arrangement directions; and two peripheral bumps located in adjacent rows of the central bump and located in different bump rows and different bump columns may have the same arrangement direction. For example, the arrangement directions of peripheral bumps PB2 and PB3 are different; the arrangement directions of peripheral bumps PB5 and PB6 are different; the arrangement directions of peripheral bumps PB2 and PB6 are different; the arrangement directions of peripheral bumps PB3 and PB5 are different; the arrangement directions of peripheral bumps PB2 and PB5 are the same; and the arrangement directions of peripheral bumps PB3 and PB6 are the same.

In some embodiments, the peripheral bumps PB2 and PB3 are located on two opposite sides of the extension line VL of the long axis of the central bump CB1 in the direction D1; the peripheral bumps PB5 and PB6 are also located on two opposite sides of the extension line VL of the long axis of the central bump CB1 in the direction D1; the peripheral bumps PB3 and PB5 are located on two opposite sides of the extension line of the short axis of the central bump CB1 in the direction D2; and the peripheral bumps PB5 and PB6 are also located on two opposite sides of the extension line of the short axis of the central bump CB1 in the direction D2.

In some embodiments, among the peripheral bumps PB2, PB3, PB5 and PB6, two bumps located on two opposite sides of the extension line of the long axis or the extension line of the short axis of the central bump CB1 are symmetrical to each other with respect to the extension line of the long axis or the extension line of the short axis. For example, the peripheral bumps PB2 and PB3 are symmetrical to each other with respect to the extension line VL of the long axis of the central bump CB1; the peripheral bumps PB5 and PB6 are symmetrical to each other with respect to the extension line VL of the long axis of the central bump CB1. The peripheral bumps PB2 and PB6 are symmetrical to each other with respect to the extension line of the short axis of the central bump CB1; the peripheral bumps PB3 and PB5 are symmetrical to each other with respect to the extension line of the short axis of the central bump CB1. In some embodiments, the peripheral bumps PB2, PB3, PB5, and PB6 each have one end part facing toward the central bump CB1. For example, the extension lines of the long axes of these bumps may extend through the central bump CB1.

In some embodiments, in the first pattern P1, distances d4 and d7 are the distances between the body part of the central bump CB1 and the corresponding body parts of the peripheral bumps PB4, PB7, respectively; and distances d2, d3, d5 and d6 are the distances between the end part of the central bump CB1 and the corresponding end parts of the peripheral bumps PB2, PB3, PB5, PB6, respectively. In some embodiments, the distance d4 between the central bump CB1 and the peripheral bump PB4 and the distance d7 between the central bump CB1 and the peripheral bump PB7 may be substantially equal to each other; the distances between the central bump CB1 and the peripheral bumps PB2, PB3, PB5, PB6 may be substantially equal to each other.

In some embodiments, in the first pattern P1 constituted by the plurality of bumps of the initial bump unit bu1, the respective bumps are arranged in the above-mentioned manner, which can effectively reduce the inductance of the central bump CB1, thereby reducing the impedance of the whole circuit of the chip and the package structure, and hence reducing the noise of the power supply system.

Figure 4B:
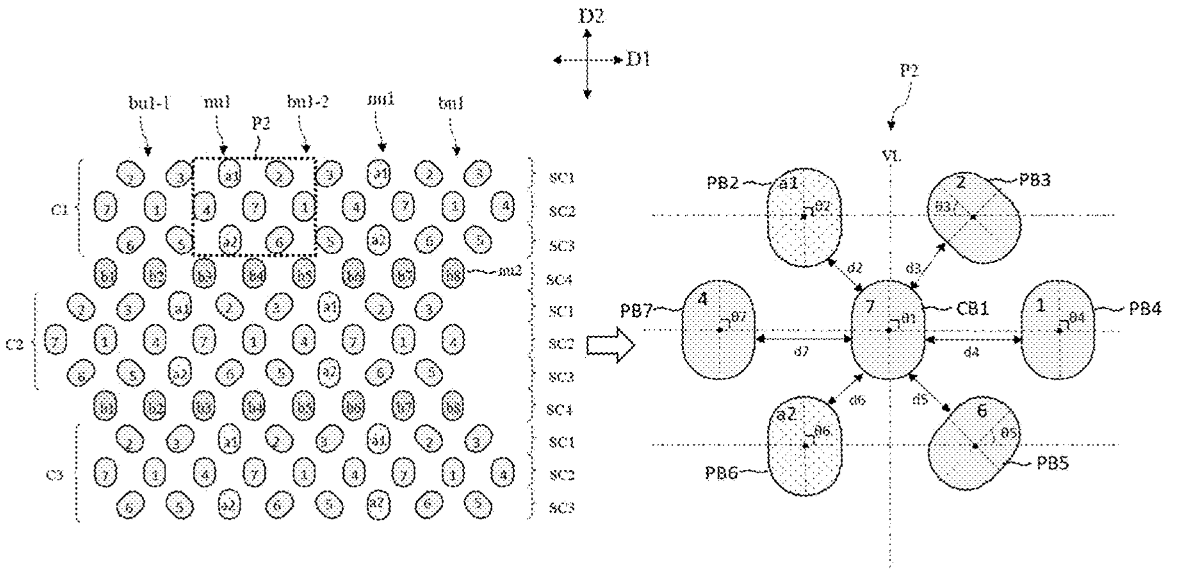

Referring to FIG. 4B, in some embodiments, each bump unit row C1, C2, C3 further includes a second pattern P2. For example, the second pattern P2 is constituted by two bumps a1, a2 in the first expanded bump unit nu1 and some bumps in adjacent initial bump units bu1. The second pattern P2 and the first pattern P1 have different patterns. For example, the rotation angles and arrangement directions of some bumps in the second pattern P2 are different from those in the first pattern P1.

In some embodiments, two bumps a1 and a2 of the first expanded bump unit nu1 are arranged in a column in the direction D2, and have centers aligned with each other in the direction D2. The arrangement directions and rotation angles of the bumps a1 and a2 may be the same as each other. For example, the long axes of the bumps a1 and a2 both extend in the direction D2, and the short axes of the bumps a1 and a2 both extend in the direction D1; that is, the rotation angles of the bumps a1 and a2 may both be 90 degrees.

The second pattern P2 may be constituted by two bumps a1 and a2 in the first expanded bump unit nu1, one bump in one of adjacent two initial bump units bu1 that are adjacent to the first expanded bump unit nu1, and five bumps in the other one of the adjacent two initial bump units bu1.

For example, as illustrated in FIG. 4B, in the initial bump unit row C1, the initial bump unit bu1-1 and the initial bump unit bu1-2 are located on two opposite sides of the first expanded bump unit nu1; and two bumps a1 and a2 of the first expanded bump unit nu1, together with the bump 4 in the initial bump unit bu1-1 and the bumps 1, 2, 6, 7 in the initial bump unit bu1-2, may constitute a second pattern P2.

In the second pattern P2 of this example, the bump 7 in the initial bump unit bu1-2 serves as the central bump CB1; the bump a1 in the first expanded bump unit nu1, the bumps 2, 1 and 6 in the initial bump unit bu1-2, the bump a2 in the first expanded bump unit nu1, and the bump 4 in the initial bump unit bu1-1 serve as peripheral bumps PB2, PB3, PB4, PB5, PB6 and PB7 respectively and together constitute the peripheral bump group.

In some embodiments, the rotation angles and arrangement directions of the central bump and some peripheral bumps in the second pattern P2 may be the same as those in the first pattern P1, while the rotation angles and arrangement directions of some other peripheral bumps in the second pattern P2 may be different from those in the first pattern P1. For example, in the second pattern P2, the central bump CB1 and the peripheral bumps PB4, PB7 may have long axes extending along the direction D2 and rotation angles of 90 degrees, which are substantially the same as those in the first pattern P1; while the arrangement directions and rotation angles of the peripheral bumps PB2, PB3, PB5 and PB6 in the second pattern P2 are different from those in the first pattern P1.

For example, in the second pattern P2, peripheral bumps PB2, PB3, PB5 and PB6 located in adjacent rows of the central bump CB1 may include bumps having arrangement directions and rotation angles as same as or different from those of the central bump; two peripheral bumps located in an adjacent row of the central bump CB1 and located in a same bump row may have different arrangement directions and different rotation angles; two peripheral bumps located in adjacent rows of the central bump CB1 and located in a same bump column may have the same rotation angles, but the arrangement directions of the two peripheral bumps may be the same as each other or different from each other; two peripheral bumps located in adjacent rows of the central bump CB1 and located in different bump rows and different bump columns may have different arrangement directions and different rotation angles.

For example, in the second pattern P2, the peripheral bumps PB2 and PB6 have the same rotation angles and the same arrangement directions. The peripheral bumps PB3 and PB5 have the same rotation angles and different arrangement directions. For example, the rotation angle θ2 of the peripheral bump PB2 and the rotation angle θ6 of the peripheral bump PB6 may both be 90 degrees; the rotation angle θ3 of the peripheral bump PB3 and the rotation angle θ5 of the peripheral bump PB5 may both be 60 degrees, but the arrangement directions of the peripheral bumps PB3 and PB5 are different from each other.

In some embodiments, in the second pattern P2, the peripheral bumps PB2 and PB6 are symmetrical to each other with respect to the extension line of the short axis of the central bump CB1; the peripheral bumps PB3 and PB5 may be symmetrical to each other with respect to the extension line of the short axis of the central bump CB1. The peripheral bumps PB2 and PB3 are asymmetrical with respect to the extension line of the long axis of the central bump CB1; the peripheral bumps PB5 and PB6 are asymmetrical with respect to the extension line of the long axis of the central bump CB1.

In the second pattern P2, similar to the first pattern P1, the distance (pitch/spacing) between the central bump CB1 and a peripheral bump located in the same bump row and having the same current direction with respect to the central bump CB1 is greater than the distance (pitch/spacing) between the central bump CB1 and a peripheral bump located in an adjacent bump row and having a different current direction with respect to the central bump CB1, so that the inductance of the central bump can be reduced. In the second pattern P2, spacings d4, d7 between the central bump CB1 and the peripheral bumps PB4, PB7 may be the same as each other, while the spacings d2, d3, d5, d6 between the central bump CB1 and the peripheral bumps PB2, PB3, PB5, PB6 may be different from each other.

Referring to FIGS. 4C to 4F, in some embodiments, some bumps in the second expanded bump unit nu2 and some bumps in adjacent bump unit rows constitute additional patterns different from the first pattern P1 and the second pattern P2.

In some embodiments, each second expanded bump unit nu2 includes bumps b1, b2, b3, b4, b5, b6, b7, b8 arranged in a row along the direction D1. The arrangement directions and rotation angles of the bumps b1-b8 may be the same as each other. For example, the long axes of the bumps b1-b8 may all extend in the direction D2, and the short axes of the bumps b1-b8 may all extend in the direction D1; that is to say, the rotation angles of the bumps b1-b8 may all be 90 degrees.

Figure 4C:
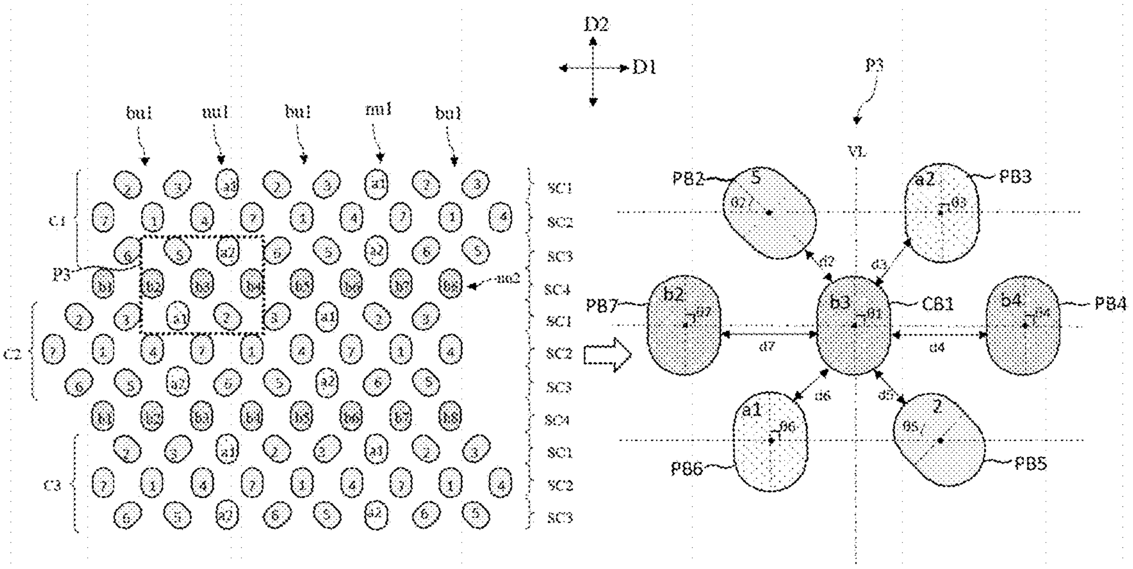
Figure 4D:
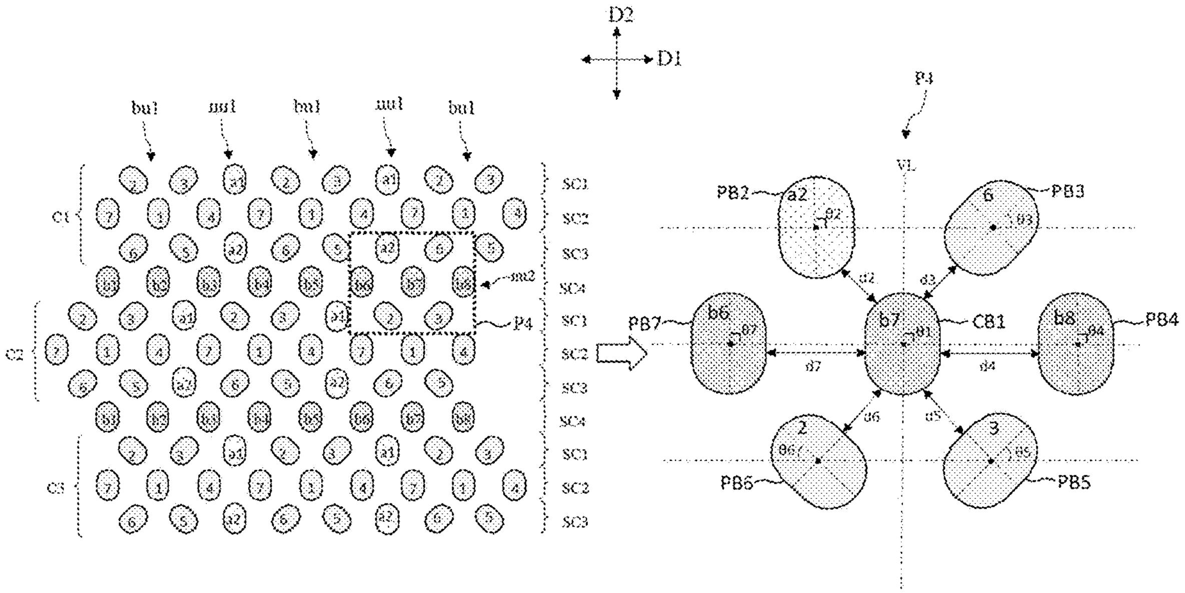

In some embodiments, the additional patterns may include a third pattern P3 illustrated in FIG. 4C and a fourth pattern P4 illustrated in FIG. 4D, and each of the third pattern P3 and the fourth pattern P4 is constituted by three adjacent bumps in the same one second expanded bump unit nu2 and four bumps in adjacent two bump unit rows located on two opposite sides of the second expanded bump unit nu2. In each of the third pattern P3 and the fourth pattern P4, the central bump is one of the corresponding three bumps in the second expanded bump unit nu2, and the peripheral bump group is constituted by the remaining two bumps of the corresponding three bumps in the second expanded bump unit and the corresponding four bumps in the adjacent two bump unit rows.

Referring to FIG. 4C, for example, three bumps b2, b3 and b4 in the second expanded bump unit nu2, together with four bumps in adjacent two bump unit rows C1 and C2 located on two opposite sides of the second expanded bump unit nu2 in the direction D2, may constitute a third pattern P3. Specifically, three bumps b2, b3 and b4 in the second expanded bump unit nu2, together with the bump 5 of the initial bump unit bu1 and the bump a2 of the first expanded bump unit nu1 in the bump unit row C1 that are adjacent to the three bumps b2-b4, the bump 2 of the initial bump unit bu1 and the bump a1 of the first expanded bump unit nu1 in the bump unit row C2 that are adjacent to the three bumps b2-b4, may constitute the third pattern P3.

For example, as illustrated in the enlarged view of the third pattern P3 in FIG. 4C, in this example, the bump b3 may serve as the central bump CB1 of the third pattern P3, while the bump 5, the bump a2, the bump b4, the bump 2, the bump a1 and the bump b2 may serve as the peripheral bumps PB2, PB3, PB4, PB5, PB6 and PB7 of the third pattern P3, respectively, and together constitute the peripheral bump group of the third pattern P3.

In the third pattern P3, the long axis of the central bump CB1 extends in the direction D2 and the short axis of the central bump CB1 extends in the direction D1; that is, the rotation angle of the central bump CB1 is 90 degrees. The peripheral bumps PB4 and PB7 that are located in the same bump row as the central bump CB1 and have the same current direction as the central bump CB1 may have arrangement directions and rotation angles as same as those of the central bump CB1; and the peripheral bumps PB4 and PB7 may be symmetrical to each other with respect to the extension line of the long axis of the central bump CB1. Peripheral bumps PB2, PB3, PB5 and PB6 located in adjacent rows of the central bump CB1 may include bumps with arrangement directions and rotation angles as same as or different from those of the central bump CB1; two peripheral bumps located in an adjacent row of the central bump CB1 and located in a same bump row may have different arrangement directions and different rotation angles; two peripheral bumps located in adjacent rows of the central bump CB1 and located in a same bump column may have different arrangement directions and different rotation angles; two peripheral bumps located in adjacent rows of the central bump CB1 and located in different bump rows and different bump columns may have the same arrangement directions and the same rotation angles.

For example, in the third pattern P3, the rotation angles θ2 and θ5 of the peripheral bumps PB2 and PB5 may both be 60 degrees; the two peripheral bumps PB2 and PB5 have the same arrangement directions, and each have an end part facing toward the central bump CB1. The rotation angles θ3 and θ6 of the peripheral bumps PB3 and PB6 may both be 90 degrees, and the two peripheral bumps PB3 and PB6 have the same arrangement directions. Among the peripheral bumps PB2, PB3, PB5 and PB6, two peripheral bumps that are located on two opposite sides of the extension line of the long axis or the short axis of the central bump CB1 and located in a same bump row or in a same bump column are asymmetrical with respect to the extension lines of both the long axis and the short axis.

In some embodiments, in the third pattern P3, distances d4 and d7 between the central bump CB1 and the peripheral bumps PB4, PB7 may be substantially equal to each other. The distances d2 and d5 between the central bump CB1 and the peripheral bumps PB2, PB5 may be substantially equal to each other; the distances d3 and d6 between the central bump CB1 and the peripheral bumps PB3, PB6 may be substantially equal to each other; and the distances d2 and d5 may be smaller than the distances d3 and d6.

Referring to FIG. 4D, for example, three bumps in the second expanded bump unit nu2, together with four bumps in adjacent two bump unit rows C1 and C2 located on two opposite sides of the second expanded bump unit nu2 in the direction D2, may constitute a fourth pattern P4. For example, three bumps b6, b7 and b8 in the second expanded bump unit nu2, together with the bump 6 of the initial bump unit bu1 and the bump a2 of the first expanded bump unit nu1 in the bump unit row C1 adjacent to the three bumps b6-b8, and bumps 2 and 3 of the initial bump unit bu1 in the bump unit row C2 adjacent to the three bumps b6-b8, may constitute a fourth pattern P4.

For example, as illustrated in the enlarged view of the fourth pattern P4 in FIG. 4D, the above-mentioned bump b7 may be used as the central bump CB1 of the fourth pattern P4; and the corresponding bumps a2, 6, b8, 3, 2 and b6 can be used as the peripheral bumps PB2, PB3, PB4, PB5, PB6 and PB7 of the fourth pattern P4 respectively, and together constitute the peripheral bump group of the fourth pattern P4.

In some embodiments, in the fourth pattern P4, the long axis of the central bump CB1 extends in the direction D2 and the short axis of the central bump CB1 extends in the direction D1; that is, the rotation angle of the central bump CB1 is 90 degrees.

The peripheral bumps PB4 and PB7 located in the same bump row as the central bump CB1 and having the same current direction as the central bump CB1 may have arrangement directions and rotation angles as same as those of the central bump CB1; and the peripheral bumps PB4 and PB7 may be symmetrical to each other with respect to the extension line of the long axis of the central bump CB1. Peripheral bumps PB2, PB3, PB5 and PB6 located in adjacent rows of the central bump CB1 may include bumps with arrangement directions and rotation angles as same as or different from those of the central bump CB1; two peripheral bumps located in an adjacent row of the central bump CB1 and located in a same bump row may have the same or different arrangement directions and the same or different rotation angles; two peripheral bumps located in adjacent rows of the central bump CB1 and located in a same bump column may have the same or different arrangement directions and the same or different rotation angles; two peripheral bumps located in adjacent rows of the central bump CB1 and located in different bump rows and different bump columns may have the same or different rotation angels but have different arrangement directions.

For example, in the fourth pattern P4, the rotation angles θ3, θ5 and θ6 of the peripheral bumps PB3, PB5, and PB6 may be the same as each other, for example, they may all be 60 degrees; the arrangement directions of the peripheral bumps PB3 and PB5 may be the same, and the arrangement direction of the peripheral bump PB6 may be different from those of the peripheral bumps PB2 and PB5. The peripheral bump PB6 and the peripheral bump PB5 may be symmetrical to each other with respect to the extension line of the long axis of the central bump CB1. The rotation angle of the peripheral bump PB2 may be the same as that of the central bump CB1, for example, may be 90 degrees.

In some embodiments, in the fourth pattern P4, spacings d4 and d7 between the central bump CB1 and the peripheral bumps PB4, PB7 may be substantially equal to each other. Spacings d5 and d6 between the central bump CB1 and the peripheral bumps PB5, PB6 may be substantially equal to each other; spacings d2 and d3 between the central bump CB1 and the peripheral bumps PB2, PB3 may be different from each other and different from the spacings d5 and d6.

Figure 4E:
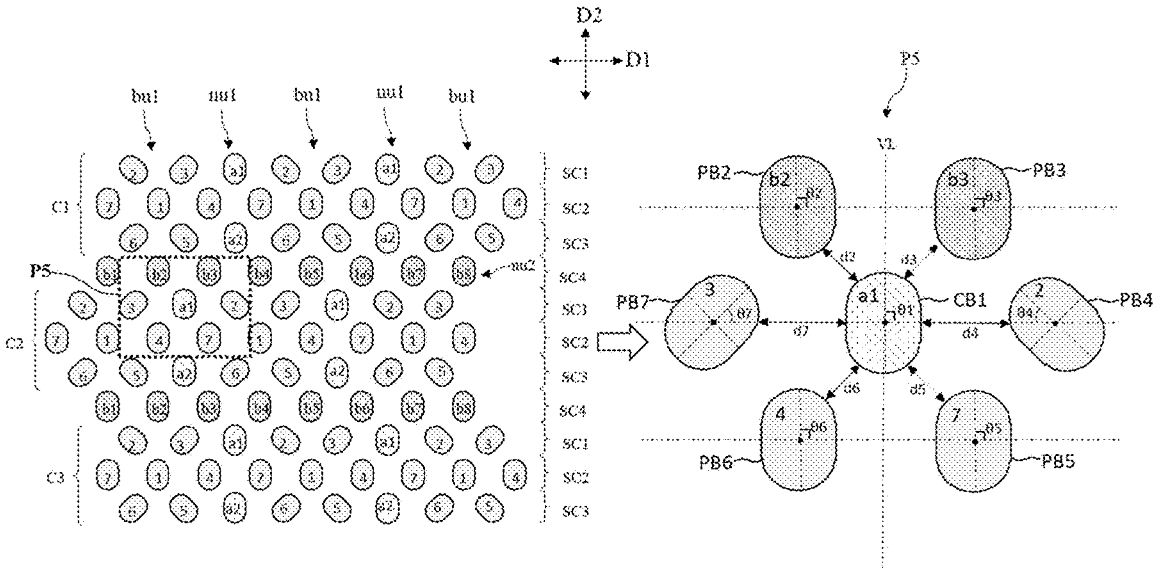
Figure 4F:
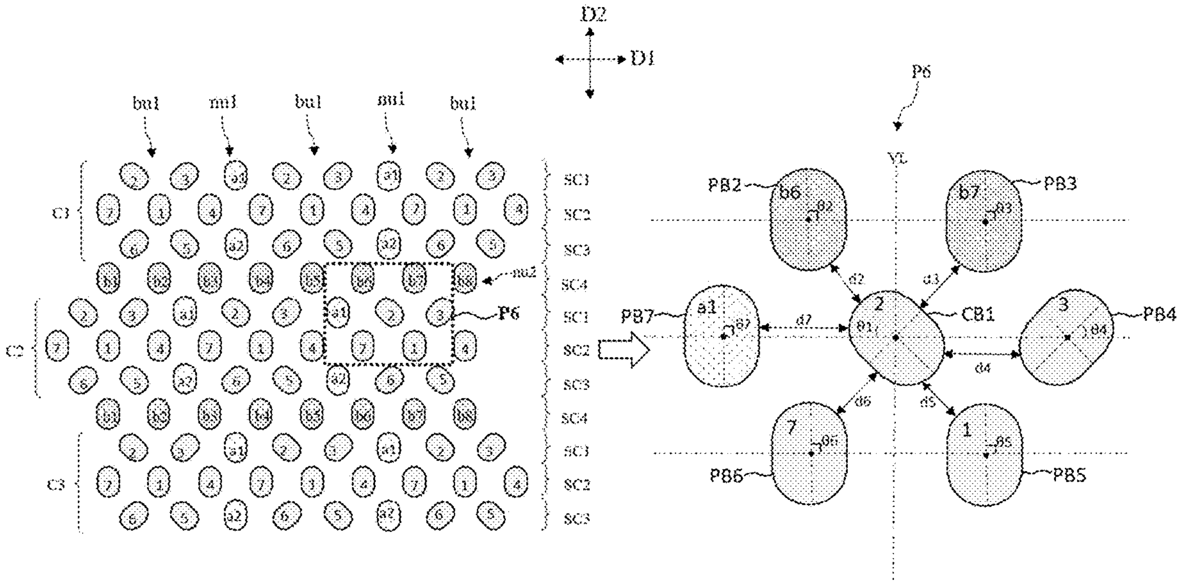

In some embodiments, the additional patterns may further include a fifth pattern P5 illustrated in FIG. 4E and a sixth pattern P6 illustrated in FIG. 4F; each of the fifth pattern P5 and the sixth pattern P6 may be constituted by two bumps in the second expanded bump unit nu2 and five bumps in an adjacent bump unit row located on one side of the second expanded bump unit nu2; and in each of the fifth pattern P5 and the sixth pattern P6, the peripheral bump group is constituted by the corresponding two bumps in the second expanded bump unit nu2 and four bumps of the corresponding five bumps in the adjacent bump unit row, and the central bump CB1 is the other one bump of the corresponding five bumps in the adjacent bump unit row.

Referring to FIG. 4E, for instance, in some examples, two bumps b2 and b3 in the second expanded bump unit nu2, together with five bumps 3, a1, 2, 4 and 7 adjacent to the two bumps and located in an adjacent bump unit row C2 at one side of the second expanded bump unit nu2 in the direction D2, may constitute a fifth pattern P5. Among the five bumps in the adjacent bump unit row C2, the bump a1 is the bump in the first expanded bump unit nu1, while the bumps 3, 4 and the bumps 2, 7 belong to two initial bump units bu1 located on two opposite sides of the first expanded bump unit nu1 in the direction D1, respectively.

For example, as illustrated in the enlarged view of the fifth pattern P5 in FIG. 4E, in this example, the bump a1 may be used as the central bump CB1 of the fifth pattern P5; while the bump b2, the bump b3, the bump 2, the bump 7, the bump 4 and the bump 3 may be used as peripheral bumps PB2, PB3, PB4, PB5, PB6 and PB7 of the fifth pattern P5, respectively, and together constitute the peripheral bump group of the fifth pattern P5.

In some examples, in the fifth pattern P5, the long axis of the central bump CB1 extends in the direction D2 and the short axis of the central bump CB1 extends in the direction D1; that is, the rotation angle θ1 of the central bump CB1 is 90 degrees. The arrangement directions and rotation angles of the peripheral bumps PB4 and PB7 located in the same bump row as the central bump CB1 and having the same current direction as the central bump CB1 may be different from those of the central bump CB1. For example, the rotation angles of the peripheral bumps PB4 and PB7 may be the same as each other, for example, both are 60 degrees, but the arrangement directions of the peripheral bumps PB4 and PB7 may be different. The peripheral bumps PB4 and PB7 may be symmetrical to each other with respect to the extension line of the long axis of the central bump CB1. Spacings d4 and d7 between the central bump CB1 and the peripheral bumps PB4, PB7 may be the same as each other.

In the fifth pattern P5, the rotation angles and arrangement directions of the peripheral bumps PB2, PB3, PB5 and PB6 located in adjacent rows of the central bump CB1 may be the same as those of the central bump CB1; that is, the rotation angles θ2, θ3, θ5 and θ6 of the peripheral bumps PB2, PB3, PB5 and PB6 may all be 90 degrees, and the long axes of these bumps may all extend in the direction D2 and the short axes of these bumps may all extend in the direction D1. Among the peripheral bumps PB2, PB3, PB5 and PB6, the corresponding two bumps located on two opposite sides of the extension line of the long axis or the extension line of the short axis of the central bump CB1 may be symmetrical with respect to the extension line of the long axis or the extension line of the short axis. Spacings d2, d3, d5 and d6 between the central bump CB1 and the peripheral bumps PB2, PB3, PB5, PB6 may be the same as each other, and may be smaller than spacings d4 and d7 between the central bump CB1 and the peripheral bumps PB4, PB7.

Referring to FIG. 4F, for example, two bumps b6 and b7 in the second expanded bump unit nu2, together with five bumps a1, 2, 3, 1 and 7 which are adjacent to the two bumps and located in an adjacent bump unit row C2 on one side of the second expanded bump unit nu2 in the direction D2, may constitute a sixth pattern P6. Among the five bumps in the adjacent bump unit row C2, the bump a1 is the bump in the first expanded bump unit nu1, while the bumps 2, 3, 1 and 7 belong to one initial bump unit bu1 located at one side of the first expanded bump unit nu1 in the direction D1.

For example, as illustrated in the enlarged view of the sixth pattern P6 in FIG. 4F, in this example, the bump 2 may serve as the central bump CB1 of the sixth pattern P6; while the bump b6, the bump b7, the bump 3, the bump 1, the bump 7 and the bump a1 may be used as peripheral bumps PB2, PB3, PB4, PB5, PB6 and PB7 of the sixth pattern P6, respectively, and together constitute the peripheral bump group of the sixth pattern P6.

In the sixth pattern P6, both the long axis and the short axis of the central bump CB1 extend in directions different from the directions D1 and D2; for example, the rotation angle θ1 of the central bump CB1 may be 60 degrees. The rotation angles and arrangement directions of the peripheral bumps PB2, PB3, PB5, PB6 and PB7 may be the same as each other, and different from those of the central bump CB1. For example, the rotation angles θ2, θ3, θ5, θ6 and θ7 of the peripheral bumps PB2, PB3, PB5, PB6 and PB7 may all be 90 degrees, that is, the long axes of these bumps may all extend in the direction D2, and the short axes of these bumps may all extend in the direction D1. The rotation angle θ4 of the peripheral bump PB4 may be as same as the rotation angle θ1 of the central bump CB1, but the arrangement directions of these two bumps are different. For example, the central bump CB1 and the peripheral bump PB4 may be symmetrical to each other with respect to the extension line of the long axis of the peripheral bump PB3 or PB5.

FIGS. 5A to 5H illustrate schematic diagrams of some derivative patterns formed by the arrangement of a plurality of conductive bumps according to some embodiments of the present disclosure, which each include the schematic diagram of the overall arrangement of the plurality of conductive bumps and the enlarged view corresponding to the respective derivative pattern.

Referring to FIGS. 5A to 5H, for example, some bumps of the plurality of conductive bumps 108 further constitute a plurality of derivative patterns DP1-DP8. Each derivative pattern may be constituted by one pattern selected from the first pattern P1, the second pattern P2 and the additional patterns such as the third pattern P3 to the sixth pattern P6 illustrated in FIGS. 4A to 4F, and two bumps located on two opposite sides of the one pattern in the direction D2. In other words, each derivative pattern may include nine bumps. For example, each derivative pattern may include a central bump, a peripheral bump group including second to seventh peripheral bumps, an eighth additional peripheral bump, and a ninth additional peripheral bump. The eighth additional peripheral bump and the ninth additional peripheral bump are located on two opposite sides of the central bump CB1 in the direction D2, and are located on sides of the peripheral bump group away from the central bump CB1, respectively. Centers of the eighth additional peripheral bump, the ninth additional peripheral bump and the central bump may be aligned with each other in the direction D2. In some embodiments, center connecting lines connecting centers of the plurality of peripheral bumps, the eighth additional peripheral bump and the ninth additional peripheral bump in the derivative pattern may be substantially in a shape of a rhombus, and the center of the central bump may be located at or near a center of the rhombus.

In some embodiments, the bump rows where the eighth additional peripheral bump and the ninth additional peripheral bump are located, are each separated from the bump row where the central bump is located by one row. Therefore, current directions of the eighth additional peripheral bump and the ninth additional peripheral bump are the same as the current direction of the central bump, and are opposite to the current directions of some peripheral bumps in the peripheral bump group.

Figure 5A:
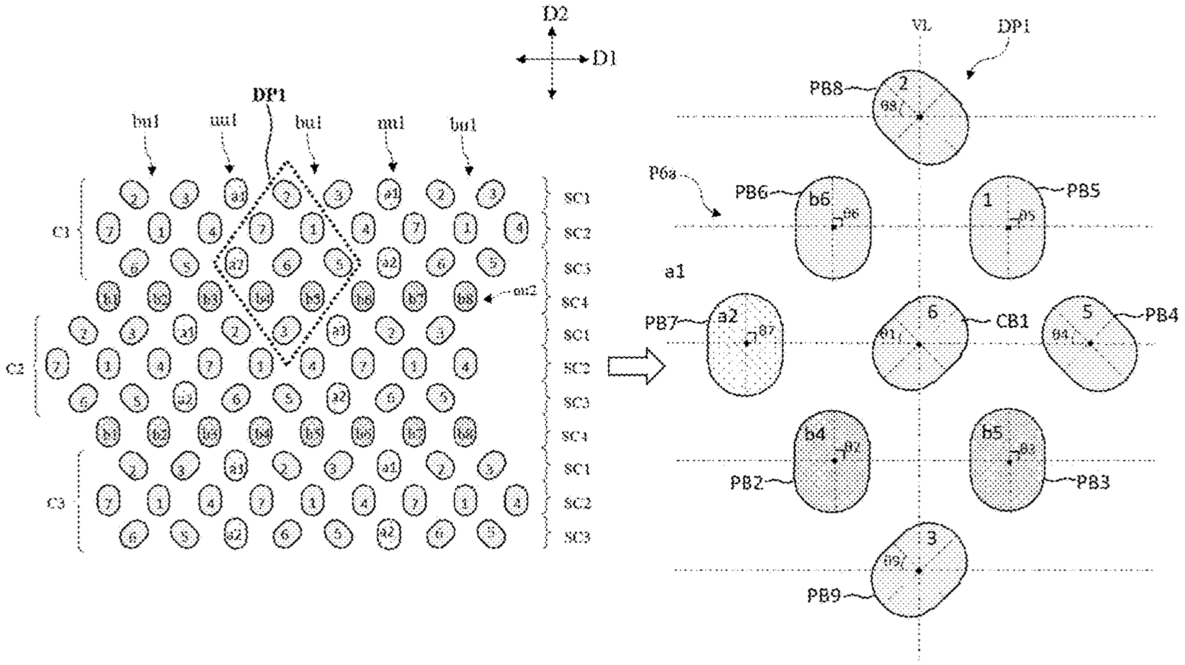
FIG. 5A to FIG. 5H illustrate schematic plan views of a plurality of conductive bumps in a chip and an enlarged view of some other bump patterns according to some embodiments of the present disclosure.

Referring to FIG. 5A, for example, the derivative pattern DP1 may be constituted by a plurality of bumps which constitute a sixth pattern P6*a*, and two bumps which are located on two opposite sides of and adjacent to the sixth pattern P6*a* in the direction D2. For example, the sixth pattern P6*a* may be constituted by bumps b4, b5 in the second expanded bump unit nu2, and five bumps 1, 5, 6, 7, a2 in an adjacent bump row C1, wherein the bump 6 serves as the central bump and the other bumps serve as the peripheral bumps. It should be noted that the sixth pattern P6*a* illustrated in FIG. 5A is constituted by bumps different from those constituting the sixth pattern P6 illustrated in FIG. 4F; and the sixth pattern P6*a* illustrated in FIG. 5A is the same as a pattern obtained by vertically flipping the sixth pattern P6 illustrated in FIG. 4F, that is, the said two patterns are substantially the same. In the derivative pattern DP1, the characteristics and relative positional relationships of the bumps in the sixth pattern P6*a* are basically the same as those in the aforementioned sixth pattern P6, and the details are not repeated here.

In the derivative pattern DP1 of this example, the bump 2 in the first bump unit row C1 serves as the eighth additional peripheral bump PB8, and the bump 3 in the second bump unit row C2 serves as the ninth additional peripheral bump PB9. The rotation angles of the eighth additional peripheral bump PB8 and the ninth additional peripheral bump PB9 may be the same as the rotation angle of the central bump CB1, for example, both are 60 degrees. The arrangement direction of one (for example, the ninth additional peripheral bump PB9) of the eighth additional peripheral bump PB8 and the ninth additional peripheral bump PB9 may be the same as that of the central bump CB1, and the arrangement direction of the other one (for example, the eighth additional peripheral bump PB8) of the eighth additional peripheral bump PB8 and the ninth additional peripheral bump PB9 may be different from that of the central bump CB1.

Figure 5B:
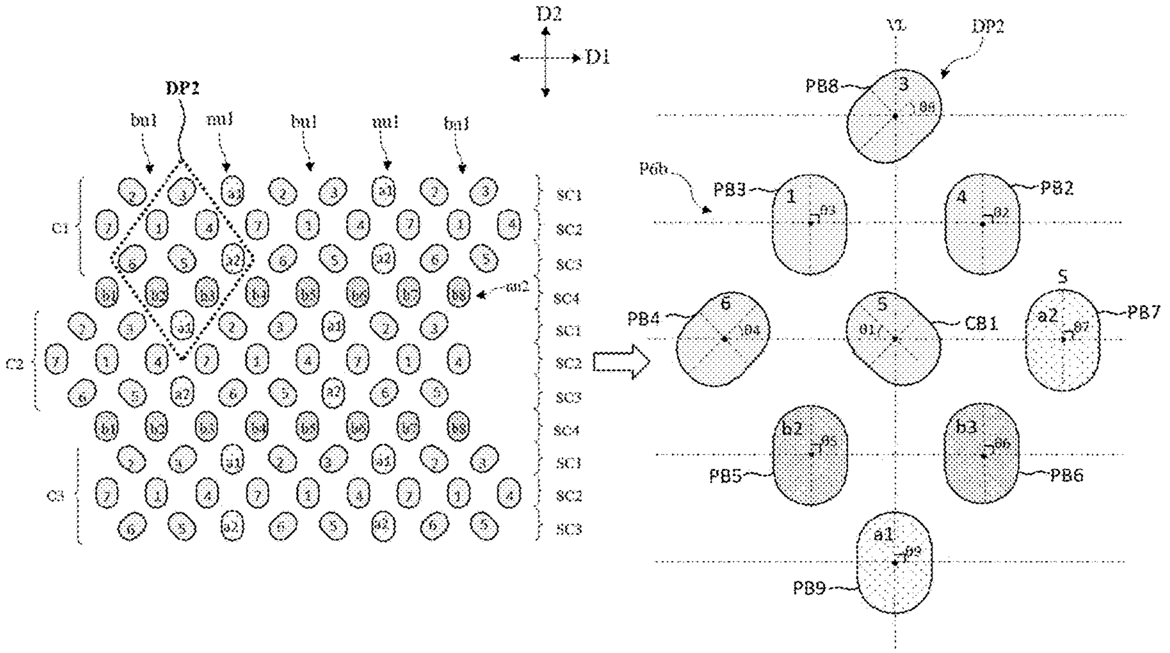

Referring to FIG. 5B, for example, the derivative pattern DP2 may be constituted by a plurality of bumps which constitute a sixth pattern P6*b*, and two bumps which are located on two opposite sides of and adjacent to the sixth pattern P6*b* in the direction D2. For example, the sixth pattern P6*b* may be constituted by bumps b2, b3 in the second expanded bump unit nu2 and five bumps 1, 4, 5, 6, a2 in an adjacent bump row C1, wherein the bump 5 is used as the central bump and the other bumps are the peripheral bumps. It should be noted that, the sixth pattern P6*b* illustrated in FIG. 5B is constituted by bumps different from those constituting the sixth pattern P6 illustrated in FIG. 4F; and the sixth pattern P6*b* illustrated in FIG. 5B is the same as a pattern obtained by horizontally flipping the sixth pattern P6 illustrated in FIG. 4F, that is, the said two patterns are substantially the same. In the derivative pattern DP2, the characteristics and relative positional relationships of the bumps in the sixth pattern P6*b* are basically the same as those in the aforementioned sixth pattern P6, and the details are not repeated here.

In the derivative pattern DP2 of this example, the bump 3 in the first bump unit row C1 serves as the eighth additional peripheral bump PB8, and the bump a1 in the second bump unit row C2 serves as the ninth additional peripheral bump PB9. The rotation angle of one of the eighth additional peripheral bump PB8 and the ninth additional peripheral bump PB9 (for example, the rotation angle θ8 of the eighth additional peripheral bump PB8) may be the same as the rotation angle θ1 of the central bump CB1, while the rotation angle of the other one of the eighth additional peripheral bump PB8 and the ninth additional peripheral bump PB9 (for example, the rotation angle θ9 of the ninth additional peripheral bump PB9) may be different from the rotation angle θ1 of the central bump CB1. For example, the rotation angle θ8 of the eighth additional peripheral bump PB8 is 60 degrees, and the rotation angle θ9 of the ninth additional peripheral bump PB9 is 60 degrees. The arrangement directions of the eighth additional peripheral bump PB8 and the ninth additional peripheral bump PB9 may both be different from the arrangement direction of the central bump CB1.

Figure 5C:
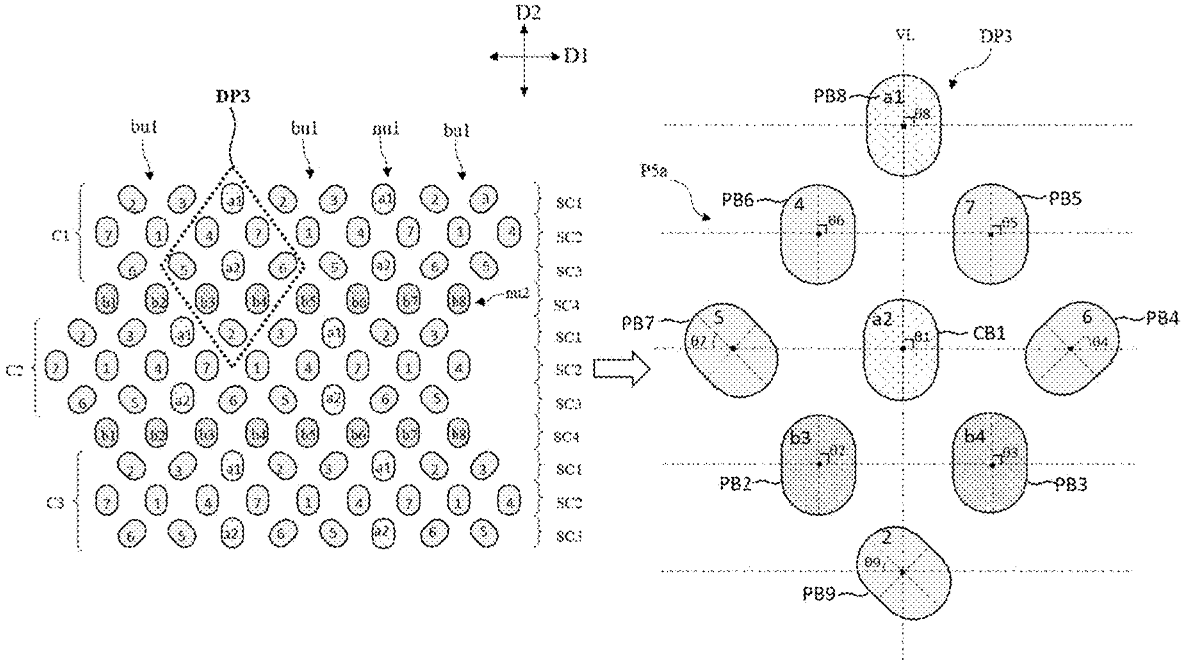

Referring to FIG. 5C, for example, the derivative pattern DP3 may be constituted by a plurality of bumps which constitute a fifth pattern P5*a*, and two bumps which are located on two opposite sides of and adjacent to the fifth pattern P5*a* in the direction D2. For example, the fifth pattern P5*a* may be constituted by bumps b3, b4 in the second expanded bump unit nu2 and five bumps 4, 7, 5, a2, 6 in an adjacent bump row C1, wherein the bump a2 serves as the central bump and the other bumps are the peripheral bumps. It should be noted that, the fifth pattern P5*a* illustrated in FIG. 5C is constituted by bumps different from those constituting the fifth pattern P5 illustrated in FIG. 4E; and the fifth pattern P5*a* illustrated in FIG. 5C is the same as the fifth pattern P5 illustrated in FIG. 4E after being vertically flipped, that is, the said two patterns are substantially the same. In the derivative pattern DP3, the characteristics and relative positional relationships of the bumps in the fifth pattern P5*a* are basically the same as those in the fifth pattern P5, and the details are not repeated here.

In the derivative pattern DP3 of this example, the bump a1 in the first bump unit row C1 serves as the eighth additional peripheral bump PB8, and the bump 2 in the second bump unit row C2 serves as the ninth additional peripheral bump PB9. The rotation angle and the arrangement direction of one of the eighth additional peripheral bump PB8 and the ninth additional peripheral bump PB9 (for example, the rotation angle θ8 and the arrangement direction of the eighth additional peripheral bump PB8) may be respectively the same as the rotation angle θ1 and the arrangement direction of the central bump CB1, while the rotation angle (for example, the rotation angle θ9 of the ninth additional peripheral bump PB9) and the arrangement direction of the other one of the eighth additional peripheral bump PB8 and the ninth additional peripheral bump PB9 may be different from those of the central bump CB1. For example, the rotation angle θ8 of the eighth additional peripheral bump PB8 is 90 degrees, and the rotation angle θ9 of the ninth additional peripheral bump PB9 is 60 degrees.

Figure 5D:
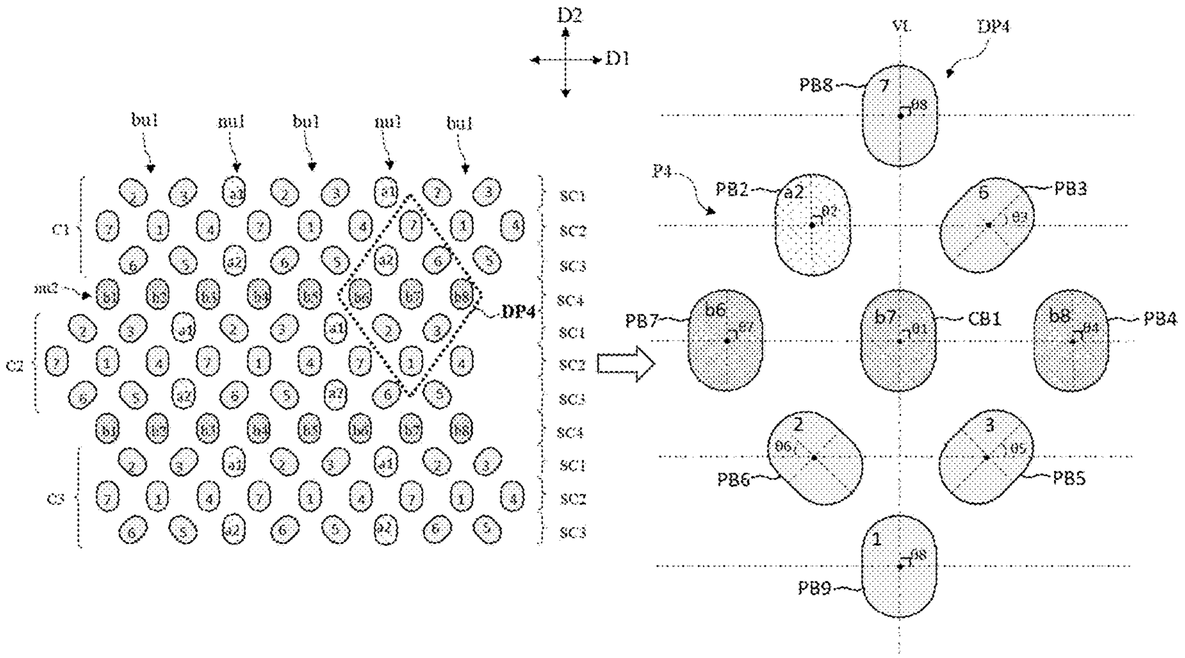

Referring to FIG. 5D, for example, the derivative pattern DP4 may be constituted by a plurality of bumps which constitute a fourth pattern, and two bumps which are located on two opposite sides of and adjacent to the fourth pattern in the direction D2. For example, the fourth pattern may be the fourth pattern P4 illustrated in FIG. 4D, but may also be an equivalent pattern that is substantially the same as the fourth pattern P4 illustrated in FIG. 4D.

In the derivative pattern DP4 of this example, the bump 7 in the first bump unit row C1 serves as the eighth additional peripheral bump PB8, and the bump 1 in the second bump unit row C2 serves as the ninth additional peripheral bump PB9. The rotation angles and arrangement directions of the eighth additional peripheral bump PB8 and the ninth additional peripheral bump PB9 may be the same as those of the central bump CB1. For example, the rotation angles of the eighth additional peripheral bump PB8 and the ninth additional peripheral bump PB9 are both 90 degrees, that is, their long axes both extend in the direction D2 and their short axes both extend in the direction D1.

Figure 5E:
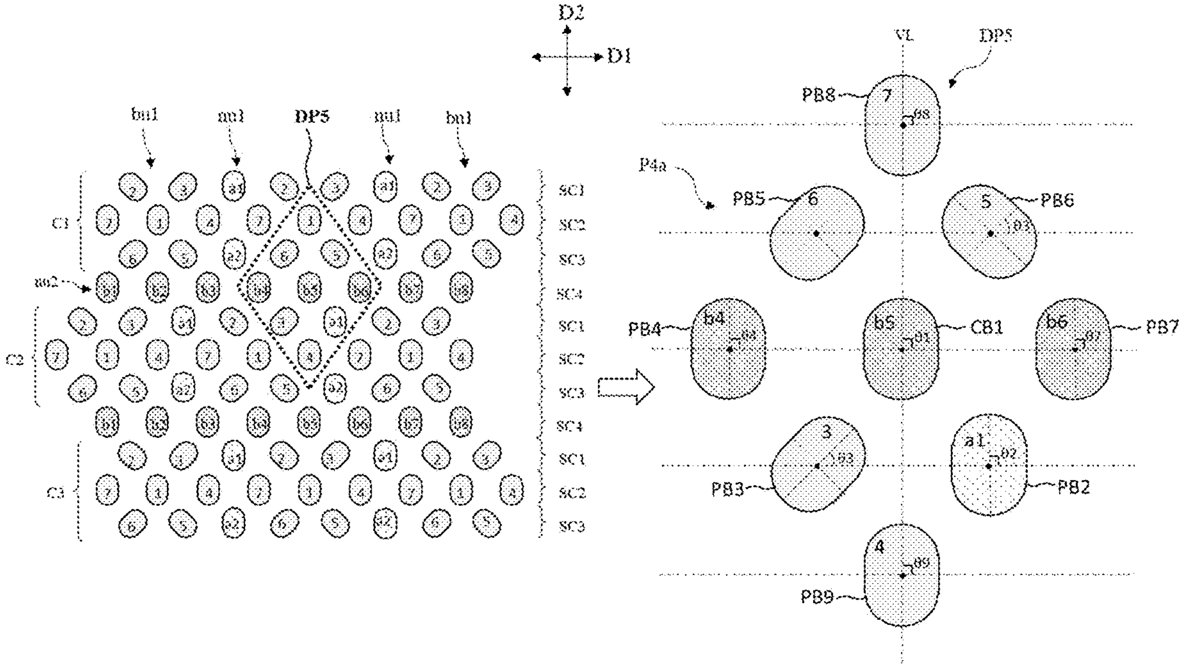

Referring to FIG. 5E, for example, the derivative pattern DP5 may be constituted by a plurality of bumps which constitute a fourth pattern P4*a*, and two bumps which are located on two opposite sides of and adjacent to the fourth pattern P4*a* in the direction D2. For example, the fourth pattern P4*a* may be constituted by three bumps b4, b5, b6 in the second expanded bump unit nu2 and bumps 5, 6, 3, a1 adjacent to the three bumps and in adjacent bump rows C1 and C2, wherein the bump b5 serves as the central bump, and the remaining bumps serve as the peripheral bumps. The fourth pattern P4*a* is the same as the fourth pattern P4 illustrated in FIG. 4D after being vertically flipped and horizontally flipped, i.e., these two patterns are substantially the same.

In the derivative pattern DP5 of this example, the bump 1 in the first bump unit row C1 serves as the eighth additional peripheral bump PB8, and the bump 4 in the second bump unit row C2 serves as the ninth additional peripheral bump PB9. The rotation angles and arrangement directions of the eighth additional peripheral bump PB8 and the ninth additional peripheral bump PB9 are the same as those of the central bump CB1. For example, the rotation angles of the eighth additional peripheral bump PB8 and the ninth additional peripheral bump PB9 are both 90 degrees, that is, their long axes both extend in the direction D2 and their short axes both extend in the direction D1. The derivative pattern DP5 is the same as the derivative pattern DP4 illustrated in FIG. 5E after being vertically flipped and horizontally flipped, that is, these two patterns are substantially the same.

Figure 5F:
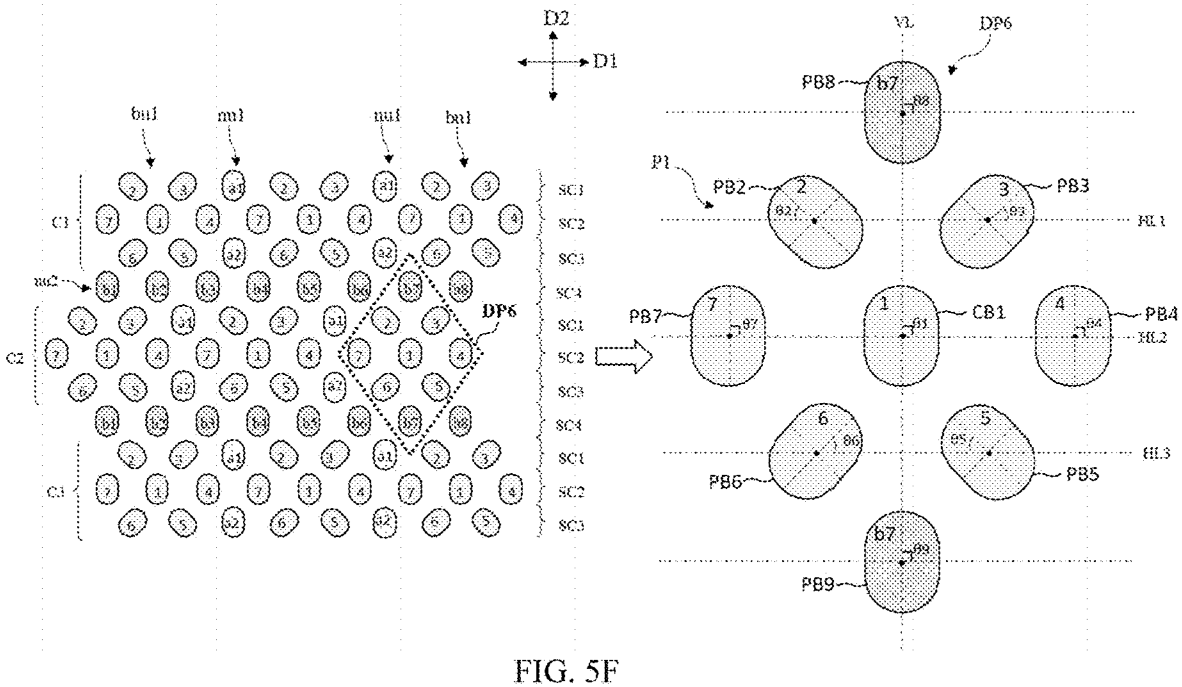

Referring to FIG. 5F, for example, the derivative pattern DP6 may be constituted by a plurality of bumps which constitute a first pattern P1, and two bumps which are located on two opposite sides of and adjacent to the first pattern P1 in the direction D2. For example, the first pattern P1 is constituted by seven bumps in an initial bump unit bu1 in the second bump unit row C2 and two bumps b7 in two second expanded bump units nu2 respectively located on two opposite sides of the initial bump unit bu1. The two bumps b7 respectively serve as the eighth additional peripheral bump PB8 and the ninth additional peripheral bump PB9.

In the derivative pattern DP6, the rotation angles and arrangement directions of the eighth additional peripheral bump PB8 and the ninth additional peripheral bump PB9 may be the same as those of the central bump CB1. For example, the rotation angles of the eighth additional peripheral bump PB8 and the ninth additional peripheral bump PB9 are both 90 degrees, that is, their long axes both extend in the direction D2 and their short axes both extend in the direction D1.

Figure 5G:
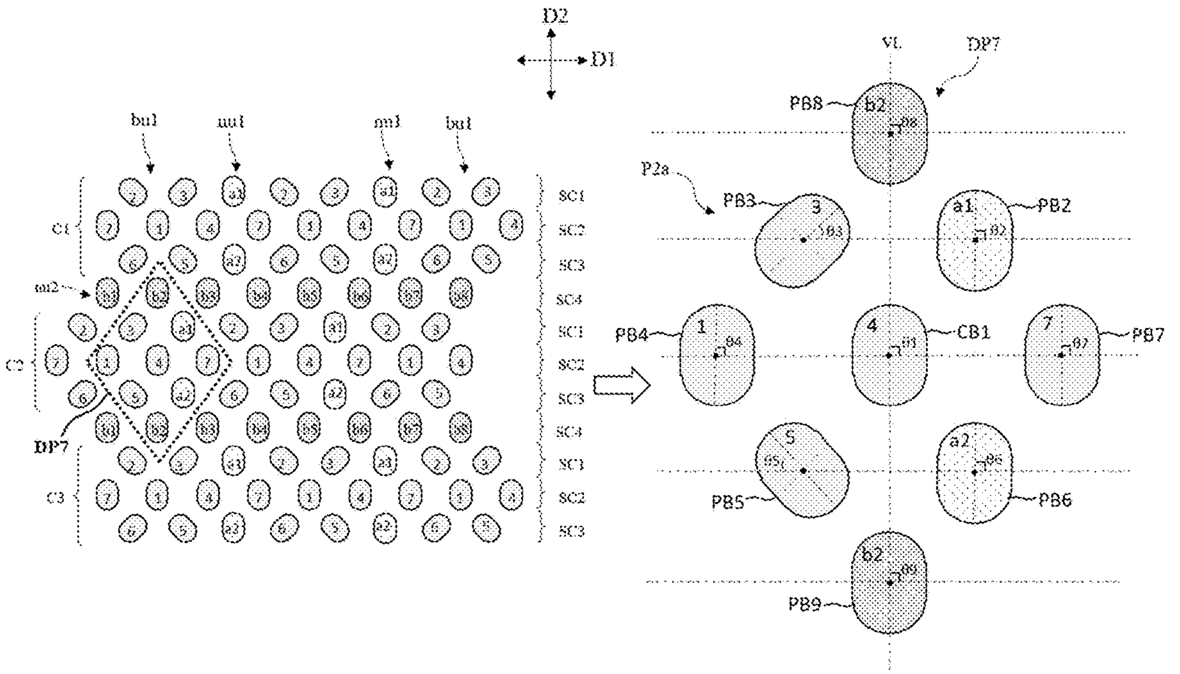

Referring to FIG. 5G, for example, the derivative pattern DP7 may be constituted by a plurality of bumps which constitute the second pattern P2*a*, and two bumps which are located on two opposite sides of and adjacent to the second pattern P2*a* in the direction D2. For example, the second pattern P2*a* may be constituted by bumps 3, a1, 1, 4, 7, 5, a2 in the second bump unit row, wherein the bump 4 serves as the central bump and the remaining bumps serve as the peripheral bumps. The second pattern P2*a* is the same as the second pattern P2 illustrated in FIG. 4B after being horizontally flipped, that is, these two patterns are substantially the same.

In the derivative pattern DP7 of this example, two bumps b2 respectively located in two second expanded bump units nu2 on two opposite sides of the second pattern P2*a* in the direction D2 are respectively used as the eighth additional peripheral bump PB8 and the ninth additional peripheral bump PB9 of the derivative pattern DP7.

In the derivative pattern DP7, the rotation angles and arrangement directions of the eighth additional peripheral bump PB8 and the ninth additional peripheral bump PB9 may be the same as those of the central bump CB1. For example, the rotation angles of the eighth additional peripheral bump PB8 and the ninth additional peripheral bump PB9 are both 90 degrees, that is, their long axes both extend in the direction D2 and their short axes both extend in the direction D1.

Figure 5H:
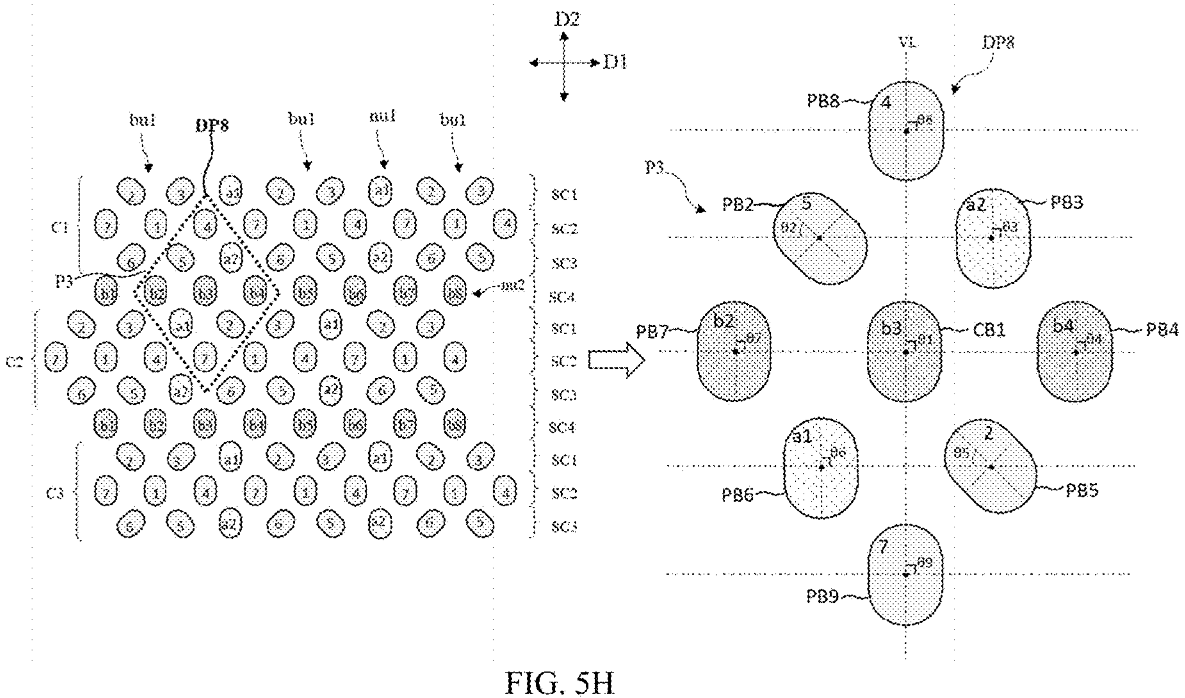

Referring to FIG. 5H, for example, the derivative pattern DP8 may be constituted by a plurality of bumps which constitute a third pattern, and two bumps which are located on two opposite sides of and adjacent to the third pattern in the direction D2. For example, the third pattern may be the third pattern P3 illustrated in FIG. 4C, but it may also be an equivalent pattern that is substantially the same as the third pattern P3 illustrated in FIG. 4C.

In the derivative pattern DP8 of this example, the bump 4 in the first bump unit row C1 serves as the eighth additional peripheral bump PB8, and the bump 7 in the second bump unit row C2 serves as the ninth additional peripheral bump PB9. The rotation angles and arrangement directions of the eighth additional peripheral bump PB8 and the ninth additional peripheral bump PB9 may be the same as those of the central bump CB1. For example, the rotation angles of the eighth additional peripheral bump PB8 and the ninth additional peripheral bump PB9 are both 90 degrees, that is, their long axes both extend in the direction D2 and their short axes both extend in the direction D1.

It should be understood that, FIGS. 5A to 5H illustrate some exemplary combinations of derivative patterns DP1-DP8, and the present disclosure is not limited thereto. Among the plurality of conductive bumps 108, there may also be a plurality of derivative patterns that are exactly or substantially the same as the above-described derivative patterns, and the bumps included in these derivative patterns may be the same as or different from those in the above-described exemplary derivative patterns. Alternatively, other types of derivative patterns may be further included in the plurality of conductive bumps 108.

Figure 6:
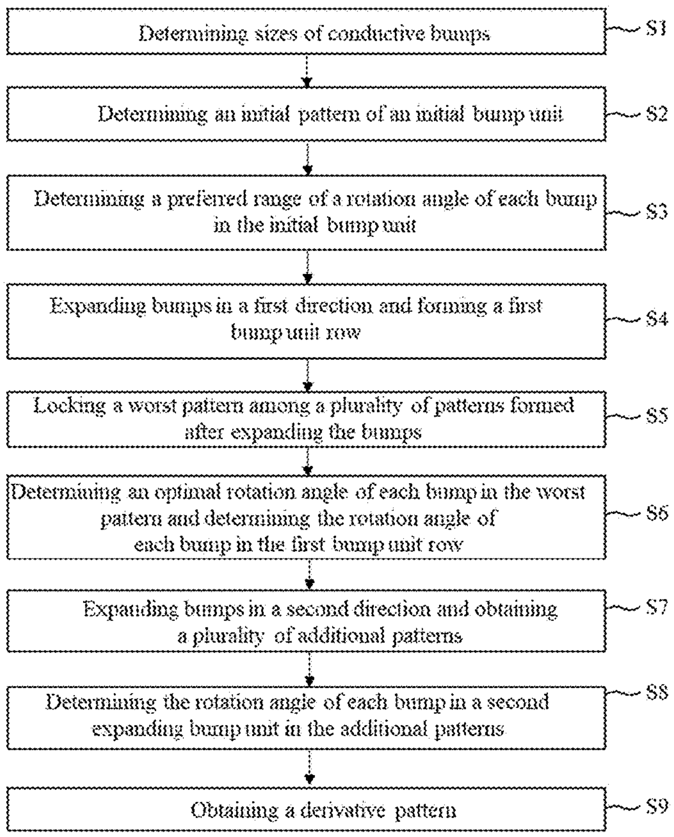
FIG. 6 is a schematic flowchart illustrating an arrangement method of a plurality of conductive bumps in a chip according to some embodiments of the present disclosure.

FIG. 6 illustrates a schematic flowchart of an arrangement method of conductive bumps in the process of forming a package structure according to some embodiments of the present disclosure. FIGS. 7A to 7D illustrate schematic top views of an arrangement method of conductive bumps in the process of forming a package structure according to some embodiments of the present disclosure.

Referring to FIG. 6, in a step S1, a size of the conductive bump 108 is determined; in some embodiments, shapes and sizes of a plurality of conductive bumps are the same as each other. For example, each bump has the shape of the conductive bump 108 as illustrated in FIGS. 2A to 2C. In some examples, each bump of the plurality of conductive bumps 108 has a length L1 of 90 microns (μm), a length L2 of 70 microns, and a height H of 58 microns. It should be understood that, the above dimensions of the conductive bumps are only for illustration, but the present disclosure is not limited thereto.

Figure 7A:
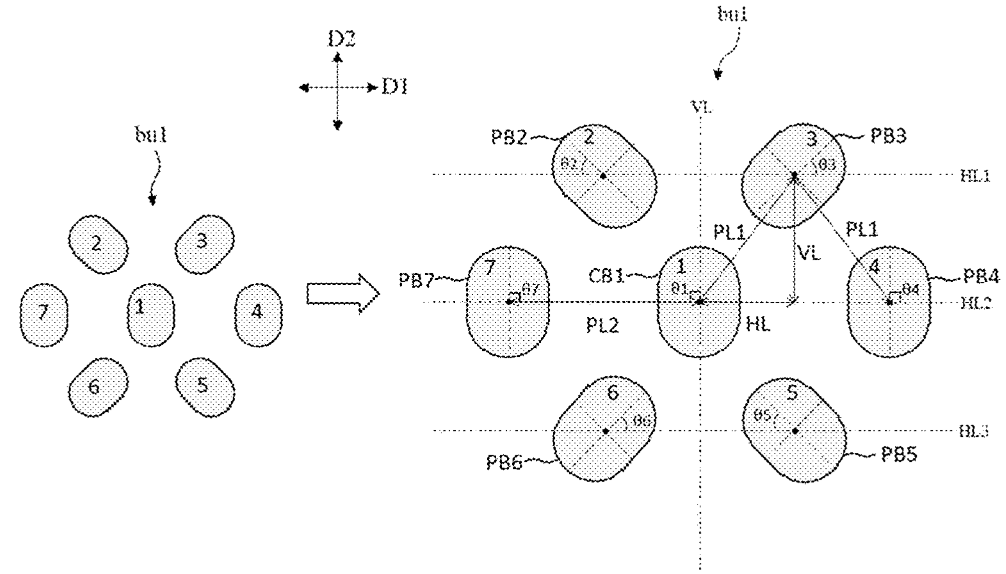
FIG. 7A to FIG. 7D illustrate schematic plan views of corresponding bumps in respective steps of an arrangement method of a plurality of conductive bumps in a chip according to some embodiments of the present disclosure.

Referring to FIGS. 6 and 7A, in a step S2, a first pattern of an initial bump unit bu1 is given, which is an initial shape of a first pattern P1 in this step, and may be referred to as an initial pattern. The initial pattern may be constituted by an initial bump unit bu1 including seven bumps 1-7. The seven bumps are arranged in three bump rows, for example, bumps 2 and 3 are arranged in a first bump row SC1; bumps 1, 4 and 7 are arranged in a second bump row SC2; and bumps 5 and 6 are arranged in a third bump row SC3. The bump 1 serves as a central bump of the initial pattern, and the other bumps serve as peripheral bumps and surround the central bump. In this step, relative positional relationships of centers of the plurality of bumps in the initial bump unit bu1 are determined, that is, the initial shape of the first pattern is generally determined. In addition, bumps located in the same row are configured to be connected to the same net and thus have the same current direction, while bumps located in adjacent rows are configured to be connected to different nets and thus have opposite current directions. For example, bumps 1, 4, and 7 may be connected to a first net, while bumps 2, 3, 5, and 6 may be connected to a second net, wherein the first net is different from the second net, for example, the first net is a power supply net VDD and the second net is a grounding net VSS, but the present disclosure is not limited thereto.

In some embodiments, due to the manufacturing process requirements of conductive bumps, a pitch between bumps needs to be greater than or equal to 130 microns, for example. Relative positions between the central bump and the peripheral bumps are determined according to the process requirements. For example, in order to reduce the distance between the central bump and the peripheral bumps in adjacent rows as much as possible, the pitch PL1 between the center of the central bump CB1 and the centers of the peripheral bumps PB2, PB3, PB5, PB6 is set to be 130 microns; in order to increase the distance between the central bump and the peripheral bumps in the same row, the pitch PL2 between the center of the central bump CB1 and the centers of the peripheral bumps PB4, PB7 is set to be greater than 130 microns. In some examples, the distance HL (or referred to as horizontal distance) between the center of the central bump CB1 and the centers of the peripheral bumps PB2, PB3, PB5, PB6 in the direction D1 is set to be 78 microns; accordingly, the distance VL (or referred to as vertical distance) between the center of the central bump CB1 and the centers of the peripheral bumps PB2, PB3, PB5, PB6 in the direction D2 is set to be 104 microns. The pitch PL2 between the central bump CB1 and the peripheral bumps PB4, PB7 is substantially equal to twice the above-mentioned distance HL, for example, is 156 microns.

In some embodiments, relative positions of the centers of the bumps in the initial bump unit bu1 are firstly determined according to the settings of distances described above. In a step S3, a preferred range of a rotation angle of each bump in the initial bump unit bu1 is determined. For example, long axes of the central bump CB1 and the peripheral bumps PB4, PB7 located in the same row are configured to be parallel to each other; for example, the rotation angles θ1, θ4 and θ7 of these bumps are set to be 90 degrees. In a case that the positions of the centers of the respective bumps in the bump unit bu1 have been determined (that is, the pitches between the bumps have been determined), by setting the rotation angles of the central bump CB1 and the peripheral bumps PB4, PB7 to be 90 degrees, the spacings between the central bump CB1 and the peripheral bumps PB4, PB7 can be increased (for example, maximized) to a certain extent. Because the current directions of the peripheral bumps PB4, PB7 are the same as that of the central bump CB1, increasing spacings between the bump CB1 and the peripheral bumps PB4, PB7 can reduce (for example, minimize) a mutual inductance on the central bump CB1 generated due to the peripheral bumps PB4, PB7, thereby reducing an inductance of the central bump CB1.

Thereafter, rotation angles of the peripheral bumps PB2, PB3, PB5 and PB6 are adjusted by the same angle, and corresponding inductance values of the central bump CB1 under cases where the peripheral bumps PB2, PB3, PB5 and PB6 are in various rotation angles are tested. The test results are illustrated in Table 1 as below. It should be noted that, in the process of adjusting the rotation angles of the peripheral bumps PB2, PB3, PB5 and PB6, the rotation angles of the peripheral bumps PB2, PB3, PB5 and PB6 are remained as the same, and end parts of these peripheral bumps are oriented towards the central bump as much as possible. Among the peripheral bumps PB2, PB3, PB5 and PB6, two peripheral bumps located at opposite sides of an extension line of the long axis or the short axis of the central bump CB1 are symmetrical with respect to the extension line of the long axis or the short axis under various rotation angles.

of the first expanded bump unit(s) nu1 illustrated in the figure are only for illustration, and the present disclosure is not limited thereto.

In some embodiments, the first expanded bump unit nu1 includes two bumps a1 and a2 arranged in the direction D1, and the bumps a1, a2 are respectively arranged in a first bump row SC1 and a third bump row SC3. In some embodiments, the rotation angles of the bumps a1 and a2 are both set to be 90 degrees, that is, the long axes of the bumps a1 and a2 both extend in the direction D2. In some embodiments, by setting the rotation angles of the bumps in the first expanded bump unit nu1 to be 90 degrees, the two bumps in the first expanded bump unit can have substantially the same influence on the mutual inductance with respect to adjacent two initial bump units bu1, and avoids the formation of extremely poor patterns. However, the present disclosure is not limited thereto.

Figure 7B:
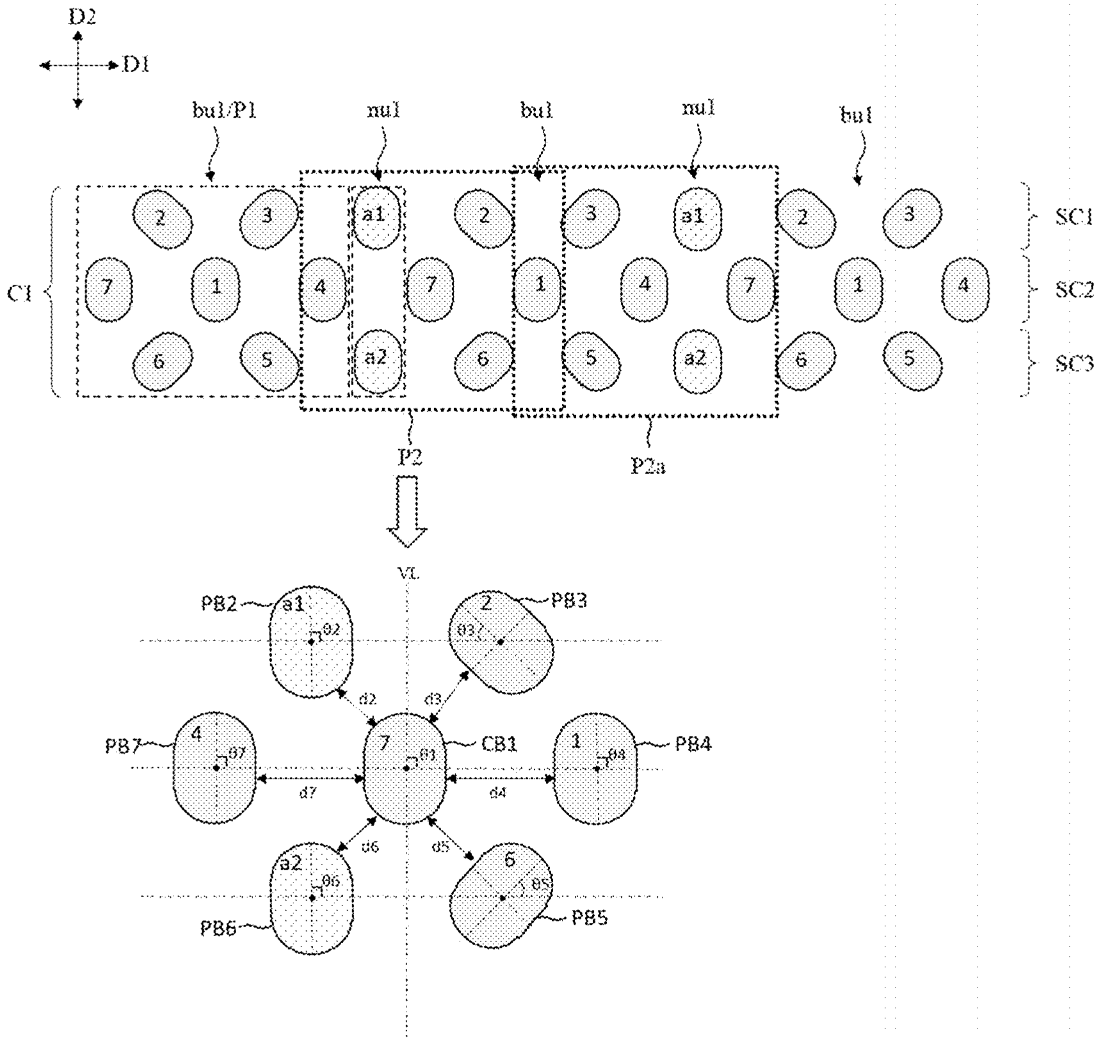

In a step S5, a worst pattern among a plurality of patterns formed after expanding the bumps (for example, after horizontally expanding the bumps) is locked. It should be understood that, herein, a worse pattern constituted by the bumps is indicative of a greater inductance of the central bump in this pattern. For example, as illustrated in FIG. 7B, after expanding the bumps, in addition to a first pattern constituted by the initial bump unit bu1, there are also second patterns P2 and P2*a* which are constituted by the first expanded bump unit nu1 and the adjacent initial bump unit bu1 and generated in the first bump unit row C1. The second patterns P2 and P2*a* are the same as each other after one of them being horizontally flipped, that is, the relative positional relationships between bumps are substantially the same in the two patterns. Therefore, the second patterns P2 and P2*a* are substantially the same patterns. That is to say, after the bumps are expanded in the horizontal direction, the first bump unit row C1 includes the first pattern P1 and the second patterns P2, P2*a*. Because the second patterns P2 and P2*a* are substantially the same patterns, the worst pattern among a plurality of patterns formed by expanding the bumps can be locked by comparing the first pattern P1 with one of the second patterns P2 and P2*a* (for example, the second pattern P2). As mentioned above, the bumps located in adjacent rows have different current directions, and the mutual inductance on the central bump generated due to the peripheral bumps having different current directions can at least partially cancel out the self-inductance of the central bump. Therefore, to a certain extent, the closer the distance between the peripheral bump located in an adjacent row and the central bump, the greater the mutual inductance on the center bump generated due to the peripheral bump, so that more of the self-inductance of the central bump can be cancelled out, and hence the inductance of the central bump is reduced. In the first pattern P1 and the second pattern P2, the end parts of the peripheral bumps PB2, PB3, PB5 and

TABLE 1

| | | | | | | | | | | | |
|---|---|---|---|---|---|---|---|---|---|---|---|
| Rotation Angle (°) | 0 | 5 | 10 | 15 | 20 | 25 | 30 | 35 | 40 | 45 | 50 |
| Inductance L (pH) | 1.9319 | 1.9044 | 1.8651 | 1.8271 | 1.7932 | 1.7598 | 1.7294 | 1.7006 | 1.6796 | 1.6658 | 1.6533 |
| Rotation Angle (°) | 51 | 52 | 53 | 54 | 55 | 56 | 57 | 58 | 59 | 60 | 61 |
| Inductance L (pH) | 1.6517 | 1.6508 | 1.6516 | 1.6533 | 1.6494 | 1.6481 | 1.6495 | 1.6499 | 1.6471 | 1.6508 | 1.6535 |

| | | | | | | | | | |
|---|---|---|---|---|---|---|---|---|---|
| Rotation Angle (°) | 62 | 63 | 64 | 65 | 70 | 75 | 80 | 85 | 90 |
| Inductance L (pH) | 1.6533 | 1.6515 | 1.6575 | 1.6588 | 1.6742 | 1.6901 | 1.7115 | 1.7396 | 1.7675 |

In Table 1, the rotation angle is the rotation angle of each of the peripheral bumps PB2, PB3, PB5 and PB6, and the inductance L is the corresponding inductance of the central bump CB1.

Figure 8A:
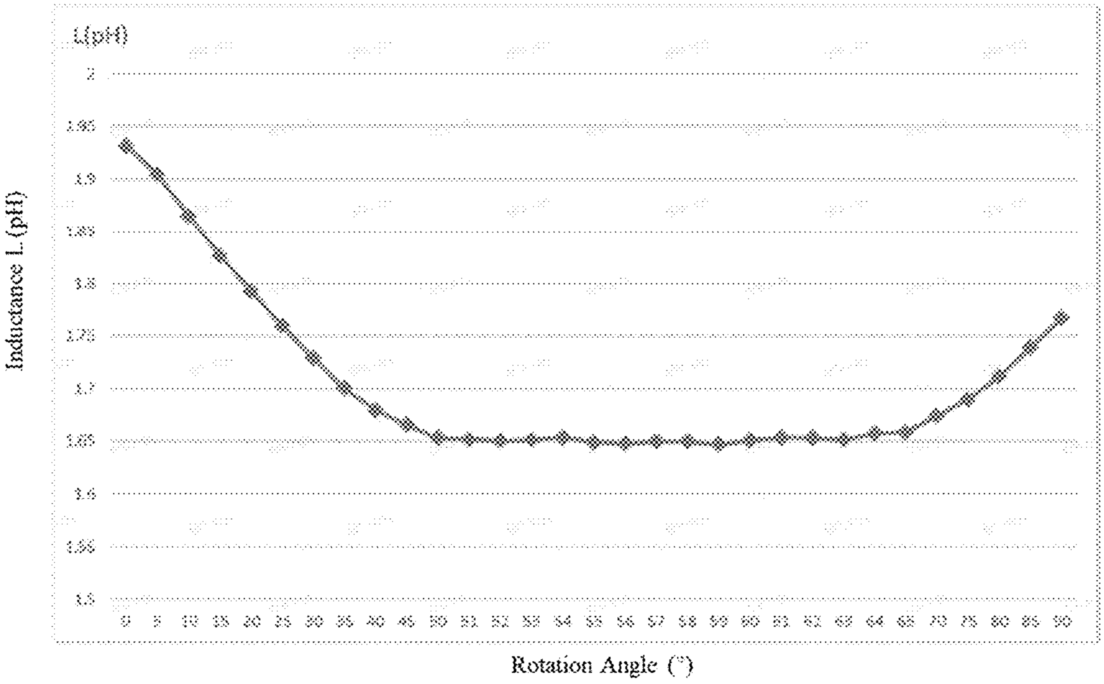
FIG. 8A and FIG. 8B each illustrate a graph of inductance values of a central bump of a corresponding bump pattern in a plurality of conductive bumps in a chip varying with variation of rotation angles of the corresponding bumps according to some embodiments of the present disclosure.

The test result in Table 1 are converted into a graph as illustrated in FIG. 8A. According to the inductance test result illustrated in the Table 1 and the graph of FIG. 8A, it can be seen that, when the rotation angles of the peripheral bumps PB2, PB3, PB5 and PB6 are in the range of 50 degrees to 65 degrees, the inductance of the central bump CB1 is relatively low; when the rotation angles of the peripheral bumps PB2, PB3, PB5 and PB6 are in the range of 51 degrees to 63 degrees, the inductance of the central bump CB1 is relatively lower. That is, the preferred range of the rotation angles of the peripheral bumps PB2, PB3, PB5 and PB6 may be 50 degrees to 65 degrees, and more preferably be 51 degrees to 63 degrees.

Referring to FIGS. 6 and 7B, in a step S4, bumps are expanded in a first direction, and a first bump unit row is formed. For example, the bumps are expanded in the direction D1, and a first bump unit row C1 is formed. The direction D1 is, for example, a horizontal direction. Expanding the bumps in the direction D1 may include: arranging a plurality of bump units bu1 along the direction D1, and the bump unit bu1 may also be referred to as a bump repeating unit; the plurality of bump units bu1 are spaced apart from each other, and a first expanded bump unit nu1 is provided between adjacent bump units bu1. That is to say, the bump units bu1 and the first expanded bump unit(s) nu1 are alternately arranged in the direction D1. It should be understood that, the number of the bump unit bu1 and the number PB6 (i.e., bumps 2, 3, 5 and 6) of the first pattern P1 are all orientated toward the central bump CB1 (i.e., bump 1), therefore, the spacings between the central pattern CB1 and these peripheral bumps are relatively small. However, in the second pattern P2, the peripheral bumps PB2, PB3, PB5 and PB6 are relatively farther away from the central bump CB1, and the mutual inductance on the central bump CB1 generated thereby is relatively small, so the self-inductance of the central bump CB1 being cancelled out is relatively less, and therefore, the inductance of the central bump CB1 in the second pattern P2 is greater than that in the first pattern P1. Therefore, the second pattern P2 is locked as the worst pattern among the plurality of patterns after the bumps are expanded in the direction D1.

Referring to FIGS. 6 and 7B, in a step S6, optimal rotation angles of the respective bumps in the worst pattern is determined, and the rotation angle of each bump in the first bump unit row is determined. In the second pattern P2, the rotation angles of the bumps located in the second bump row SC2 and the bumps in the first expanded bump unit nu1 have been determined as 90 degrees, and it is necessary to determine the optimal rotation angles of the bumps 2 and 6 located in the adjacent rows of the central bump. For example, the rotation angles of the bumps 2 and 6 are adjusted by the same angle, and the corresponding inductance values of the central bump CB1 (that is, the bump 7) in the second pattern P2 under the cases with different rotation angles of the bumps 2 and 6 are tested. In the process of adjusting the rotation angles of the bumps 2 and 6, the rotation angles of the bumps 2 and 6 are remained as the same, and the bumps 2 and 6 are symmetrical with respect to the extension line of the long axis of the bump 7, with the end parts of the bumps 2 and 6 remained as being orientated toward the bump 1 in the initial bump unit bu1. As it can be seen from the test results in Table 1 and FIG. 8A, the preferred range for the bumps 2, 3, 5 and 6 is 50 degrees to 65 degrees, and the more preferred range of the bumps 2, 3, 5 and 6 is 51 degrees to 63 degrees. Therefore, adjusting the rotation angles of the bumps 2 and 6 by the same angle includes adjusting the rotation angles of the bumps 2 and 6 within the angle range in the preferred range or the more preferred range. For example, the rotation angles of the bumps 2 and 6 are adjusted within an angle range of 50 degrees to 65 degrees, and the test results are illustrated in Table 2 as below:

TABLE 2

| Rotation Angle (°) | 50 | 51 | 52 | 53 | 54 | 55 | 56 | 57 |
|---|---|---|---|---|---|---|---|---|
| Inductance L (pH) | 1.8942 | 1.8903 | 1.8876 | 1.8853 | 1.8825 | 1.8804 | 1.8809 | 1.8766 |
| Rotation Angle (°) | 58 | 59 | 60 | 61 | 62 | 63 | 64 | 65 |
| Inductance L (pH) | 1.8751 | 1.8734 | 1.8660 | 1.8639 | 1.8619 | 1.8573 | 1.8524 | 1.8491 |

In Table 2, the rotation angle is the rotation angle of each of the bumps 2 and 6, and the inductance L is the inductance corresponding to the bump 7 (that is, the central bump CB1 of the second pattern). It should be understood that, if the second pattern P2*a* is tested, the above-mentioned rotation angle is the rotation angle of each of the bumps 3 and 5, and the inductance L is the inductance corresponding to the bump 4 (that is, the central bump of the second pattern P2*a*). The test results in Table 2 are converted into a graph as illustrated in FIG. 8B.

Figure 8B:
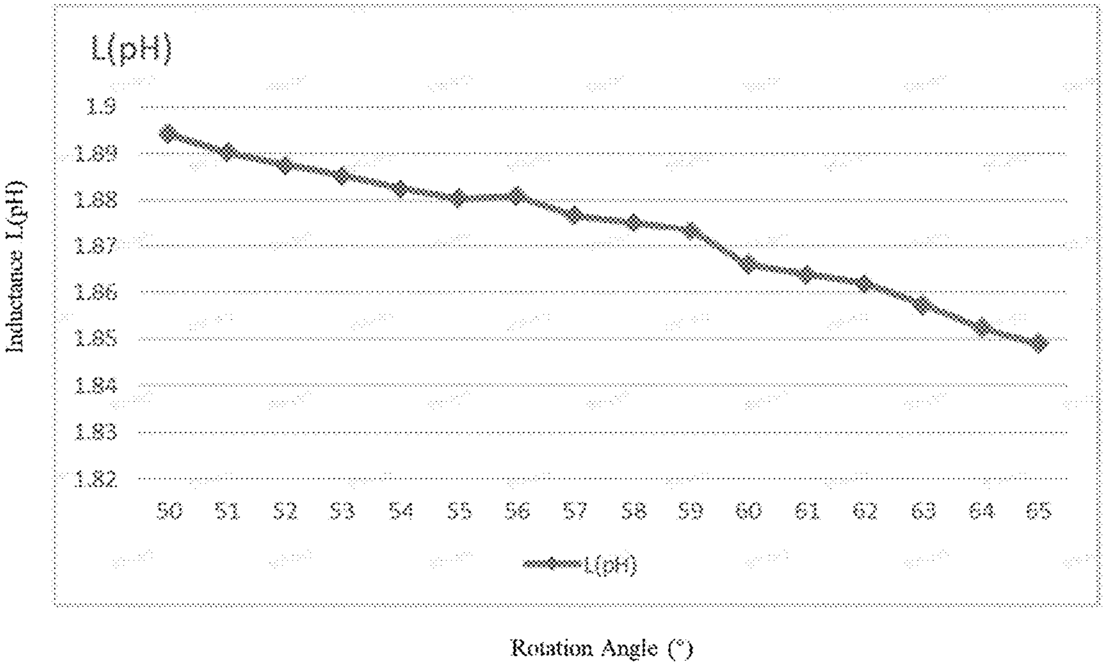

According to Table 1, Table 2, FIG. 8A and FIG. 8B, it can be seen that, when the rotation angles of the bumps 2, 6, 3 and 5 are 60 degrees, the central bumps of the first pattern (i.e., the optimal pattern) P1 and the second patterns (i.e., the worst pattern) P2, P2*a* all have relatively lower inductance values. Therefore, in order to ensure that both the optimal pattern and the worst pattern have relatively low inductance values, the rotation angles of the bumps 2, 3, 5 and 6 are determined to be 60 degrees. In this way, the rotation angles of the respective bumps in the first bump unit row C1 after horizontally expanding the bumps are thus determined; that is, the rotation angles of the bumps 1, 4 and 7 in the second bump row SC2 and the bumps a1 and a2 in the first expanded bump unit nu1 are 90 degrees, while the rotation angles of the bumps 2, 3, 5 and 6 in the first bump row SC1 and the third bump row SC3 are all 60 degrees, with each of the bumps 2, 3, 5 and 6 having an end part being orientated toward the bump 1 in the corresponding bump unit bu1. Therefore, the relative positional relationships of the plurality of bumps as well as the rotation angle and arrangement direction of each bump in the first bump unit row C1 have all been determined.

Figure 7C:
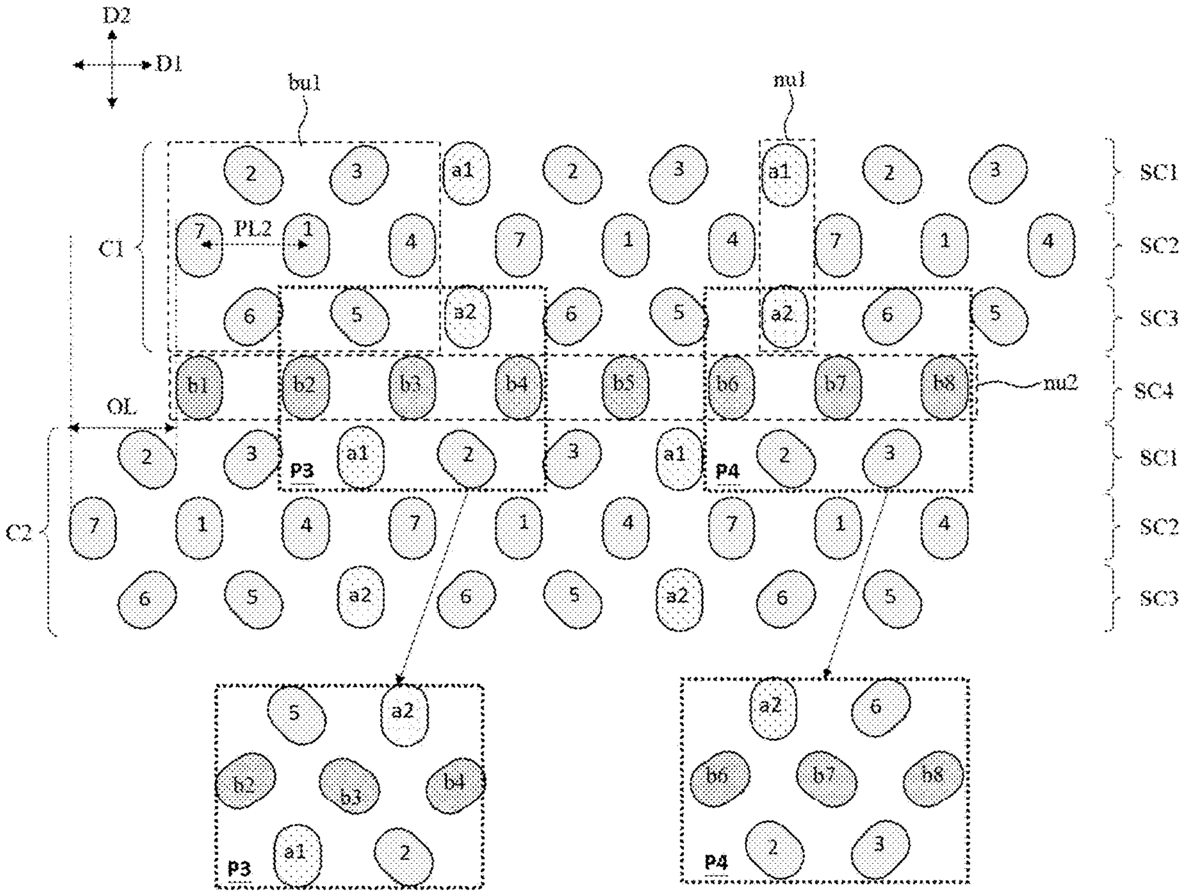

Referring to FIGS. 6 and 7C, in a step S7, the bumps are expanded in a second direction, and a plurality of additional patterns are obtained. For example, the bumps are expanded in the direction D2, and additional patterns, such as a third pattern P3 and a fourth pattern P4, are obtained. The direction D2 is, for example, a vertical direction. In some embodiments, expanding the bumps in the direction D2 includes: providing, in the direction D2, a repeating unit of the pattern of the first bump unit row C1 obtained in FIG. 7B; for example, providing a second bump unit row C2, which has a pattern as same as that of the first bump unit row C1 and is arranged at a side of the first bump unit row C1 in the direction D2. In some embodiments, the second bump unit row C2 is spaced apart from the first bump unit row C1 by one row; and expanding the bumps in the second direction further includes: providing a second expanded bump unit nu2 between the first bump unit row C1 and the second bump unit row C2; and the second expanded bump unit nu2 includes bumps b1-b8 arranged along the direction D1.

In some embodiments, the second bump unit row C2 is laterally offset from the first bump unit row C1 in the direction D1, for example, by a distance OL. The distance OL may also be referred to as an offset distance between the second bump unit row C2 and the first bump unit row C1 in the direction D1. In some embodiments, the offset distance OL may be substantially the same as the pitch PL2 between adjacent bumps in the same bump row, or the offset distance OL may be an integer multiple of the pitch PL2, such that first patterns P1 constituted by a plurality of bump units bu1 are offset in the direction D1. In some embodiments, by offsetting two bump unit rows, which are adjacent in the direction D2, from each other in the direction D1, extremely poor additional patterns can be avoided from being formed.

Referring to FIGS. 6 and 7C, after the bumps are expanded in the direction D2 by disposing the second expanded bump unit nu2 and the second bump unit row C2, new additional patterns are generated; for example, the additional patterns include a third pattern P3 and a fourth pattern P4. The third pattern P3 and the fourth pattern P4 are each constituted by three bumps in the second expanded bump unit nu2 and four bumps in the two bump unit rows C1, C2 adjacent thereto. It should be understood that, the additional patterns also include other patterns substantially the same as the third pattern P3 and the fourth pattern P4, each constituted by other three bumps in the second expanded bump unit and four bumps in the adjacent two bump unit rows, which will not be repeated here.

In a step S8, the rotation angles of the respective bumps in the second expanded bump unit in the additional pattern are determined. For example, the rotation angles of the respective bumps of the second expanded bump unit in the additional pattern is adjusted, and the inductance value of the central bump in the corresponding additional pattern is tested, so as to determine the optimal rotation angle of each bump in the second expanded bump unit. The adjustment range of the rotation angle of the bump can be 0 to 90 degrees. In the testing process, the rotation angles of the corresponding bumps in the second expanded bump unit are adjusted by the same angle, and two bumps adjacent to each other in the direction D2 in the second expanded bump unit are remained as being symmetrical. For example, the lower figure in FIG. 7C illustrates the state of the pattern when the rotation angle of each bump in the second expanded bump unit is 55 degrees during the test.

In some embodiments, the test results for the third pattern P3 are illustrated in the following Table 3, and the test results for the fourth pattern P4 are illustrated in the following Table 4.

TABLE 3

| Rotation Angle (°) | 30 | 35 | 40 | 45 | 50 | 55 | 60 | 65 | 70 | 75 | 90 |
|---|---|---|---|---|---|---|---|---|---|---|---|
| Inductance L(pH) | 1.8870 | 1.8659 | 1.8415 | 1.8224 | 1.7990 | 1.7824 | 1.7600 | 1.7457 | 1.7301 | 1.7180 | 1.7081 |

TABLE 4

| Rotation Angle (°) | 30 | 35 | 40 | 45 | 50 | 55 | 60 | 65 | 70 | 75 | 90 |
|---|---|---|---|---|---|---|---|---|---|---|---|
| Inductance L(pH) | 2.0165 | 1.9952 | 1.9739 | 1.9535 | 1.9338 | 1.9185 | 1.8962 | 1.8845 | 1.8678 | 1.8586 | 1.8402 |

In Tables 3 and 4, the rotation angles are the rotation angles of the corresponding bumps in the second expanded bump unit nu1 in the third and fourth patterns, and the inductances are the inductance values corresponding to the central bumps of the corresponding patterns (for example, the bump b3 in the third pattern P3, the bump b7 in the fourth pattern P4). It should be noted that, the inductance values corresponding to the rotation angles of 0 to 30 degrees are relatively higher, and are not listed in Tables 3 and 4; instead, only the inductance values corresponding to the rotation angles within the range of 30 degrees to 90 degrees are listed in Tables 3 and 4. As can be seen from the results in Tables 3 and 4, in each of the third pattern P3 and the fourth pattern P4, when the rotation angles of the bumps in the second expanded bump unit nu1 are 90 degrees, the inductance of the central bump is relatively lower.

Therefore, through the above tests and by comparing the test results, it is determined that the rotation angle of each bump b1-b8 in the second expanded bump unit nu1 is set to be 90 degrees, that is, the long axes of the bumps b1-b8 extend in the direction D2 and the short axes of the bumps b1-b8 extend in the direction D1. In this way, the rotation angle of each bump in each bump unit row C1, C2 and the second expanded bump unit nu2 located between adjacent bump unit rows is determined. Because the rotation angle of each bump has been determined, other additional patterns (for example, the fifth pattern P5 illustrated in FIG. 4E and the sixth pattern P6 illustrated in FIG. 4F) can be calculated and determined accordingly without further adjustment.

Figure 7D:
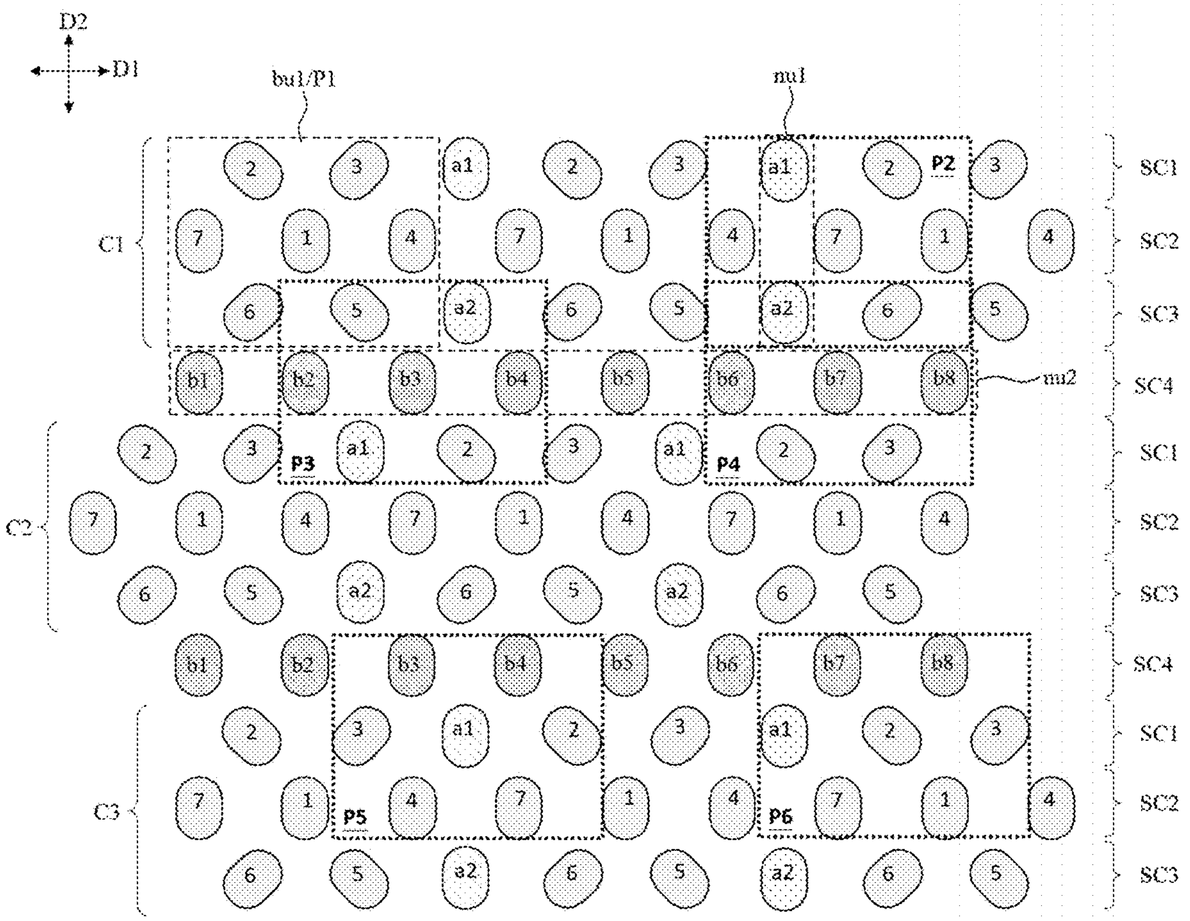

Referring to FIG. 7D, in some embodiments, the bumps can also be further expanded in the direction D2, for example, a repeating unit including the second expanded bump unit and the bump unit row is continuously provided, and the adjacent bump unit rows are offset from each other in the direction D1 by a distance OL. Because the relative positions and rotation angles of the respective bumps in the bump unit rows and the second expanded bump unit have been determined in the step of FIG. 7C, the position and rotation angle of each bump can be determined in the subsequent process of further expanding the bumps, without further test and adjustment. It should be understood that, the number of the bump unit rows and the number of the second expanded bump units illustrated in the figure are only for illustration, and the present disclosure is not limited thereto.

In some embodiments, the inductance values of the central bumps in the first to sixth patterns P1 to P6 are illustrated in the following Table 5:

TABLE 5

| Pattern | P1 | P2 | P3 | P4 | P5 | P6 |
|---|---|---|---|---|---|---|
| Inductance L(pH) | 1.6508 | 1.8660 | 1.7081 | 1.8402 | 1.7876 | 1.8132 |

Referring to FIGS. 6 and 7D, in a step S9, derivative patterns are obtained. For example, after the bumps are expanded in the directions D1 and D2, in addition to the first pattern D1 to the sixth pattern D6 each including seven bumps, a plurality of derivative patterns are also generated in the overall pattern constituted by a plurality of bumps. The derivative patterns include, for example, derivative patterns DP1 to DP8 illustrated in FIGS. 5A to 5H. In the overall bump pattern, because the position and rotation angle of each bump have been determined, it is unnecessary to adjust the positions and/or rotation angles of the bumps in the derivative patterns. In some examples, the inductance values of the central bumps in the derivative patterns DP1 to DP8 are illustrated in the following Table 6:

TABLE 6

| Pattern | DP1 | DP2 | DP3 | DP4 | DP5 | DP6 | DP7 | DP8 |
|---|---|---|---|---|---|---|---|---|
| Inductance L(pH) | 5.2655 | 5.2753 | 5.2586 | 5.3053 | 5.3071 | 5.0937 | 5.3432 | 5.1611 |

It should be noted that. in the above-mentioned testing processes with respect to the Tables 1 to 6, the inductance values of the central bumps of the corresponding patterns are all tested in separate patterns. In the overall pattern of a plurality of conductive bumps, some other bumps located on a side of the peripheral bumps away from the central bump are relatively farther from the central bump, so the mutual inductance on the central bump generated due to these bumps is extremely small and negligible, or no mutual inductance will be generated due to these bumps with respect to the central bump. Therefore, the inductance value of the central bump tested in the above-mentioned separate pattern is substantially the same as or approaches to that of the central bump in the overall pattern. It should be understood that, each bump can serve as a central bump in a corresponding pattern. By taking the inductance value of the central bump of each bump pattern as a reference, the optimal arrangement mode of each bump pattern can be determined, so that the optimal arrangement mode (rotation angle, arrangement direction, etc.) for each bump in the plurality of bumps can be determined. Through this arrangement mode, the overall inductance of a plurality of conductive bumps can be decreased, and the impedance in the circuit of the chip and the package structure can be reduced, thereby reducing the voltage drop at the bump end of the chip when current flows through the plurality of conductive bumps, and hence reducing the noise of the power supply and improving the device performance.

It should be understood that, FIG. 6 and FIGS. 7A to 7D exemplarily illustrate the arrangement method of the bumps according to the embodiments of the present disclosure and the optimal arrangement modes are described by way of example to explain the arrangement method, but the present disclosure is not limited thereto. In some other embodiments, the values of the rotation angles of the corresponding bumps can also be set within corresponding preferred ranges instead of the above-mentioned specific values, which can also allow to achieve the technical effect of reducing the parasitic inductance of the conductive bumps and reducing the inductive reactance generated by the conductive bumps to a certain extent, thereby reducing the impedance in the circuit of the chip and the package structure to a certain extent, and hence reducing the noise of the power supply system. For example, in a plurality of conductive bumps 108, in the case that the relative positional relationships between the centers of the bumps are determined, the rotation angles of the bumps 2, 3, 5, and 6 can range from 50 degrees to 65 degrees, or from 51 degrees to 63 degrees; and the rotation angles of the bumps 1, 4, 7, a1, a2 and b1-b8 can range from 75 degrees to 90 degrees.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A chip, comprising:

a base substrate; and a plurality of conductive bumps, located on a side of the base substrate, wherein a planar shape of each bump of the plurality of conductive bumps in a direction parallel to a main surface of the base substrate has a long axis and a short axis which extend through a center of the bump, a length of the long axis is greater than a length of the short axis, and each bump has a rotation angle defined by an included angle between the long axis of the bump and a reference axis along a first direction, and the plurality of conductive bumps comprise:

a plurality of bump unit rows, wherein each bump unit row of the plurality of bump unit rows comprises a plurality of initial bump units arranged along the first direction and a first expanded bump unit located between adjacent initial bump units; wherein a plurality of bumps of each initial bump unit are arranged as a first pattern; the first expanded bump unit and part of bumps in adjacent initial bump units constitute a second pattern; and the second pattern is different from the first pattern; and a second expanded bump unit, comprising a plurality of bumps arranged in a row along the first direction, wherein the plurality of bump unit rows are arranged in a second direction, and each second expanded bump unit is located between adjacent bump unit rows in the second direction intersecting with the first direction, wherein part of bumps in the second expanded bump unit and part of bumps in adjacent bump unit rows constitute an additional pattern different from the first pattern and the second pattern, wherein numbers of bumps comprised in the first pattern, the second pattern and the additional pattern are the same; relative positional relationships of centers of bumps comprised in the first pattern, the second pattern and the additional pattern are the same; and the first pattern, the second pattern and the additional pattern each have bumps with different rotation angles.

2. The chip according to claim 1, wherein each bump unit row comprises a first bump row, a second bump row and a third bump row; the initial bump unit comprises two bumps located in the first bump row, three bumps located in the second bump row and two bumps located in the third bump row; the first expanded bump unit comprises two bumps respectively located in the first bump row and the third bump row; and the plurality of bumps of the second expanded bump unit are located in a fourth bump row;

wherein a plurality of bumps located in odd rows are configured to transmit current in a first current direction and have centers aligned in the second direction; a plurality of bumps located in even rows are configured to transmit current in a second current direction and have centers aligned in the second direction; the first current direction is different from the second current direction; and the plurality of bumps located in the odd rows and the plurality of bumps located in the even rows are laterally offset from each other in the first direction.

3. The chip according to claim 1, wherein each of the first pattern, the second pattern and the additional pattern comprises a central bump and a peripheral bump group, and the peripheral bump group is arranged around the central bump and surrounds the central bump;

the peripheral bump group comprises a second peripheral bump, a third peripheral bump, a fourth peripheral bump, a fifth peripheral bump, a sixth peripheral bump and a seventh peripheral bump which are arranged clockwise or counterclockwise, wherein the fourth peripheral bump and the seventh peripheral bump are located in a same bump row as the central bump; the second peripheral bump and the third peripheral bump are located in a same bump row; the fifth peripheral bump and the sixth peripheral bump are located in a same bump row; and wherein a group comprising the second peripheral bump and the third peripheral bump, and a group comprising the fifth peripheral bump and the sixth peripheral bump, are respectively located in adjacent two bump rows on two opposite sides of the bump row where the central bump is located;

the peripheral bump group comprises a bump with a rotation angle as same as that of the central bump, and also comprises a bump with a rotation angle different from that of the central bump.

4. The chip according to claim 3, wherein in at least one of the first pattern, the second pattern and the additional pattern, a distance between the central bump and one of the fourth peripheral bump and the seventh peripheral bump is greater than a distance between the central bump and one of the second peripheral bump, the third peripheral bump, the fifth peripheral bump and the sixth peripheral bump.

5. The chip according to claim 3, wherein in the first pattern, the central bump, the fourth peripheral bump and the seventh peripheral bump each have a first rotation angle; and the second peripheral bump, the third peripheral bump, the fifth peripheral bump and the sixth peripheral bump each have a second rotation angle, and each have an end part being orientated toward the central bump; and the second rotation angle is smaller than the first rotation angle.

6. The chip according to claim 5, wherein in the first pattern, among the second peripheral bump, the third peripheral bump, the fifth peripheral bump and the sixth peripheral bump, corresponding two peripheral bumps located on opposite sides of an extension line of the long axis or the short axis of the central bump are symmetrical with respect to the extension line of the long axis or the short axis.

7. The chip according to claim 5, wherein a plurality of bumps of the first expanded bump unit and of the second expanded bump unit each have the first rotation angle.

8. The chip according to claim 3, wherein in the second pattern, the central bump, the second peripheral bump, the fourth peripheral bump, the sixth peripheral bump and the seventh peripheral bump each have a first rotation angle; the third peripheral bump and the fifth peripheral bump each have a second rotation angle; and the second rotation angle is smaller than the first rotation angle.

9. The chip according to claim 3, wherein the additional pattern comprises a third pattern and a fourth pattern, each of the third pattern and the fourth pattern is constituted by three bumps in the second expanded bump unit and four bumps in adjacent two bump unit rows located on two opposite sides of the second expanded bump unit;

the additional pattern further comprises a fifth pattern and a sixth pattern, each of the fifth pattern and the sixth pattern is constituted by two bumps in the second expanded bump unit and five bumps in an adjacent bump unit row located on one side of the second expanded bump unit.

10. The chip according to claim 9, wherein the additional pattern satisfies at least one of following features:

in the third pattern, the central bump, the third peripheral bump, the fourth peripheral bump, the sixth peripheral bump and the seventh peripheral bump each have a first rotation angle; and the second peripheral bump and the fifth peripheral bump each have a second rotation angle;

in the fourth pattern, the central bump, the second peripheral bump, the fourth peripheral bump and the seventh peripheral bump each have the first rotation angle; and the third peripheral bump, the fifth peripheral bump and the sixth peripheral bump each have the second rotation angle;

in the fifth pattern, the central bump, the second peripheral bump, the third peripheral bump, the fifth peripheral bump and the sixth peripheral bump each have the first rotation angle; and the fourth peripheral bump and the seventh peripheral bump each have the second rotation angle; and in the sixth pattern, the central bump and the fourth peripheral bump each have the second rotation angle; and the second peripheral bump, the third peripheral bump, and the fifth to the seventh peripheral bumps each have the first rotation angle, wherein the second rotation angle is smaller than the first rotation angle.

11. The chip according to claim 3, wherein the plurality of conductive bumps further comprise a plurality of derivative patterns; and each derivative pattern of the plurality of derivative patterns is constituted by one pattern of the first pattern, the second pattern and the additional pattern, and two bumps located one two opposite sides of the one pattern in the second direction;

wherein each derivative pattern comprises the central bump, the peripheral bump group having the second to seventh peripheral bumps, an eighth additional peripheral bump and a ninth additional peripheral bump; wherein centers of the eighth additional peripheral bump, the ninth additional peripheral bump and the central bump are aligned with each other in the second direction.

12. The chip according to claim 11, wherein in each derivative pattern, a rotation angle of at least one of the eighth additional peripheral bump and the ninth additional peripheral bump is the same as a rotation angle of the central bump corresponding thereto.

13. The chip according to claim 11, wherein the plurality of derivative patterns satisfy at least one of following conditions:

in a derivative pattern comprising the first pattern, the second pattern, the third pattern or the fourth pattern, both the eighth additional peripheral bump and the ninth peripheral bump have a same first rotation angle as that of the central bump;

in a derivative pattern comprising the fifth pattern, one of the eighth additional peripheral bump and the ninth peripheral bump has a same first rotation angle as that of the central bump, and the other one of the eighth additional peripheral bump and the ninth peripheral bump has a second rotation angle;

in a derivative pattern comprising the sixth pattern, one of the eighth additional peripheral bump and the ninth additional peripheral bump has a same second rotation angle as that of the central bump, and the other one of the eighth additional peripheral bump and the ninth additional peripheral bump has a first rotation angle; or, the eighth additional peripheral bump and the ninth additional peripheral bump both have the second rotation angle, and extension directions of long axes of the eighth additional peripheral bump and the ninth additional peripheral bump are different.

14. A chip, comprising:

a base substrate; and a plurality of conductive bumps, located on a side of the base substrate, wherein a planar shape of each bump of the plurality of conductive bumps in a direction parallel to a main surface of the base substrate has a long axis and a short axis extending through a center of the bump, and a length of the long axis is greater than a length of the short axis, wherein the plurality of conductive bumps comprise:

a first bump row, comprising a plurality of first bump groups arranged along a first direction and one or more first additional bumps each located between adjacent first bump groups, wherein each of the plurality of first bump groups comprises two first bumps adjacent to each other;

a second bump row, comprising a plurality of bumps arranged along the first direction;

a third bump row, comprising a plurality of second bump groups arranged along the first direction and one or more second additional bumps each located between adjacent second bump groups, wherein each of the plurality of second bump group comprises two second bumps adjacent to each other; and a fourth bump row, comprising a plurality of bumps arranged along the first direction, wherein the first bump row to the fourth bump row are sequentially arranged along a second direction, and the second direction intersects with the first direction;

wherein long axes of a plurality of bumps in the second bump row and the fourth bump row as well as the one or more first additional bump and the one or more second additional bump all extend along the second direction; extension directions of long axes of the first bumps and the second bumps are different from the first direction and the second direction; and the two first bumps in a same first bump group and the two second bumps in a corresponding same second bump group each have an end part being orientated toward a same one bump located in the second bump row.

15. The chip according to claim 14, wherein the first bump row to the third bump row constitute a repeating unit; the plurality of conductive bumps comprise a plurality of repeating units arranged in the second direction and one or more fourth bump rows each located between adjacent repeating units; and the adjacent repeating units are offset from each other in the first direction.

16. The chip according to claim 14, wherein among the plurality of conductive bumps, at least part of a plurality of bumps located in odd rows are arranged in a column and have centers aligned with each other in the second direction; and at least part of a plurality of bumps located in even rows are arranged in a column and have centers aligned with each other in the second direction; and the plurality of bumps located in the odd rows and the plurality of bumps located in the even rows are offset from each other in the first direction.

17. A package structure, comprising:

the chip according to claim 1; and a package substrate, wherein the chip is electrically connected to the package substrate through the plurality of conductive bumps.

18. A method for forming a chip, comprising:

providing a base substrate, and forming a plurality of conductive bumps on a side of the base substrate, wherein a planar shape of each bump of the plurality of conductive bumps in a direction parallel to a main surface of the base substrate has a long axis and a short axis which extend through a center of the bump, a length of the long axis is greater than a length of the short axis, and each bump has a rotation angle defined by an included angle between the long axis of the bump and a reference axis along a first direction, and the plurality of conductive bumps comprise:

a plurality of bump unit rows, wherein each bump unit row of the plurality of bump unit rows comprises a plurality of initial bump units arranged along the first direction and a first expanded bump unit located between adjacent initial bump units; wherein a plurality of bumps of each initial bump unit are arranged as a first pattern; the first expanded bump unit and part of bumps in adjacent initial bump units constitute a second pattern; and the second pattern is different from the first pattern; and a second expanded bump unit, comprising a plurality of bumps arranged in a row along the first direction, wherein the plurality of bump unit rows are arranged in a second direction, and each second expanded bump unit is located between adjacent bump unit rows in the second direction intersecting with the first direction, wherein part of bumps in the second expanded bump unit and part of bumps in adjacent bump unit rows constitute an additional pattern different from the first pattern and the second pattern; wherein numbers of bumps comprised in the first pattern, the second pattern and the additional pattern are the same; relative positional relationships of centers of bumps comprised in the first pattern, the second pattern and the additional pattern are the same; and the first pattern, the second pattern and the additional pattern each have bumps with different rotation angles.

19. The method for forming the chip according to claim 18, wherein each of the first pattern, the second pattern and the additional pattern comprises one central bump and a plurality of peripheral bumps arranged around the central bump and surrounding the central bump;

wherein forming the plurality of conductive bumps comprises:

determining a shape and a size of each bump in the plurality of conductive bumps, and providing the first pattern constituted by the initial bump unit;

adjusting the rotation angle of a corresponding bump in the first pattern, testing an inductance value corresponding to the central bump of the first pattern to obtain a first inductance test result, and determining a preferred angle range of the rotation angle of the corresponding bump in the first pattern according to the first inductance test result;

expanding bumps in the first direction to form a first bump unit row, the first bump unit row comprising the first pattern and the second pattern;

adjusting the rotation angle of a corresponding bump in the second pattern with reference to the preferred angle range, testing an inductance value corresponding to the central bump of the second pattern to obtain a second inductance test result, and determining the rotation angle of each bump in the first bump unit row by combining the first inductance test result and the second inductance test result;

expanding bumps in the second direction by providing the second expanded bump unit and a second bump unit row, and obtaining the additional pattern, wherein the second bump unit row is a repeating unit of the first bump unit row;

adjusting the rotation angle of a corresponding bump of the second expanded bump unit in the additional pattern, and testing an inductance value corresponding to the central bump of the additional pattern to obtain a third inductance test result; and determining the rotation angle of each bump in the second expanded bump unit according to the third inductance test result.

20. The method for forming the chip according to claim 19, wherein providing the second bump unit row comprises: offsetting the second bump unit row relative to the first bump unit row in the first direction.

* * * * *